(12) United States Patent
Shimizu

(10) Patent No.: US 8,331,470 B2
(45) Date of Patent: Dec. 11, 2012

(54) COMMUNICATION SYSTEM

(75) Inventor: Masahiko Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 502 days.

(21) Appl. No.: 12/575,785

(22) Filed: Oct. 8, 2009

(65) Prior Publication Data

US 2010/0091899 A1 Apr. 15, 2010

(30) Foreign Application Priority Data

Oct. 9, 2008 (JP) .................................. 2008-262612

(51) Int. Cl.
*H04L 5/12* (2006.01)
(52) U.S. Cl. ........ 375/262; 375/316; 375/295; 375/260; 375/261; 714/780; 714/790; 714/755; 714/699; 714/746; 714/786; 714/757; 714/800; 714/810; 714/715; 714/758
(58) Field of Classification Search .................. 375/262, 375/316, 295, 260, 261; 714/780, 790, 755, 714/699, 746, 786, 757, 800, 810, 751, 758
See application file for complete search history.

(56) References Cited

U.S. PATENT DOCUMENTS

| | | | |
|---|---|---|---|
| 6,233,711 B1 | 5/2001 | Murayama et al. | |
| 7,131,049 B2* | 10/2006 | Kim et al. | 714/751 |
| 2002/0126763 A1* | 9/2002 | Jeong et al. | 375/295 |
| 2006/0077076 A1* | 4/2006 | Hoshino et al. | 341/50 |
| 2007/0248176 A1* | 10/2007 | Miyoshi | 375/260 |
| 2007/0291868 A1* | 12/2007 | Olesen et al. | 375/267 |
| 2008/0130784 A1* | 6/2008 | Shimizu et al. | 375/295 |

FOREIGN PATENT DOCUMENTS

| | | |
|---|---|---|
| JP | 2002-344548 | 11/2002 |
| JP | 2004-297182 | 10/2004 |
| JP | 2008-141312 | 6/2008 |
| WO | 99/12265 | 3/1999 |

* cited by examiner

*Primary Examiner* — Siu Lee
(74) *Attorney, Agent, or Firm* — Katten Muchin Rosenman LLP

(57) ABSTRACT

A communication system that performs encoding and decoding for communication includes a transmitting apparatus and a receiving apparatus. The transmitting apparatus includes a turbo encoding unit including a first encoding unit that encodes an input signal and generates a first parity bit by bit-based encoding and n (n=1, 2, 3, . . . ) second encoding units that encode the input signal and generate second parity bits by bit-based encoding, and a symbol mapping unit that maps an output from the turbo encoding unit to a symbol by bit-based mapping operation and modulates the output. And the receiving apparatus includes a demodulating unit that demodulates a transmission signal, and a turbo decoding unit that performs turbo decoding on the demodulated signal by bit-based decoding.

12 Claims, 33 Drawing Sheets

$s_0 = 0 \rightarrow s_0' = s_0 = 0 \quad p_0 = s_0 + s_{-1} = 0 + 0 = 0$
$s_1 = 1 \rightarrow s_1' = s_1 = 1 \quad p_1 = s_1 + s_0 = 1 + 0 = 1$
$s_2 = 1 \rightarrow s_2' = s_2 = 1 \quad p_2 = s_2 + s_1 = 1 + 1 = 0$
$s_3 = 1 \rightarrow s_3' = s_3 = 1 \quad p_3 = s_3 + s_2 = 1 + 1 = 0$
$s_4 = 0 \rightarrow s_4' = s_4 = 0 \quad p_4 = s_4 + s_3 = 0 + 1 = 1$
$s_5 = 1 \rightarrow s_5' = s_5 = 1 \quad p_5 = s_5 + s_4 = 1 + 0 = 1$

⋮  ⋮  ⋮

| INFORMATION SERIES | | CODE SERIES | |
|---|---|---|---|
| 0 | → | 0 | 0 |
| 1 | → | 1 | 1 |
| 1 | → | 1 | 0 |
| 1 | → | 1 | 0 |
| 0 | → | 0 | 1 |
| 1 | → | 1 | 1 |
| ⋮ | | ⋮ | |

FIG. 22
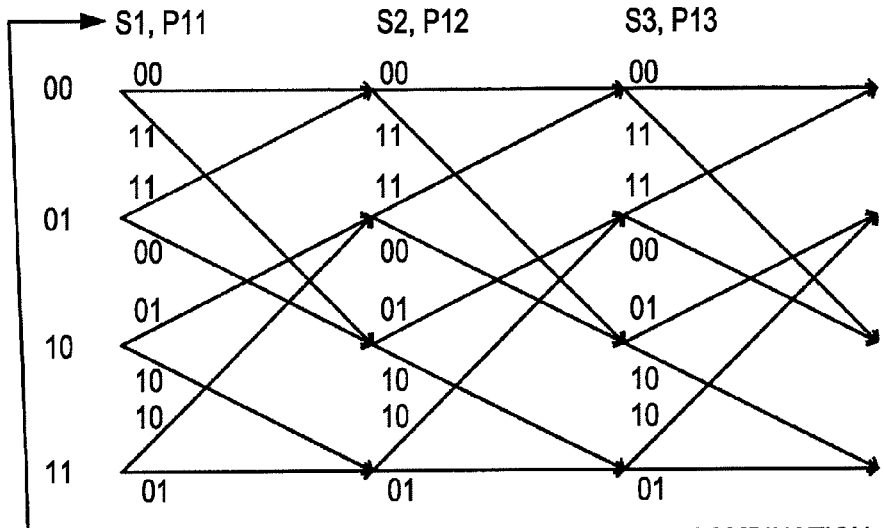
CALCULATE LIKELIHOOD ON THE BASIS OF COMBINATION
OF SYSTEMATIC BIT S AND PARITY BIT P1
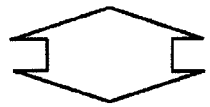
INTERLEAVING FOR EACH BIT
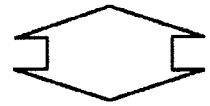
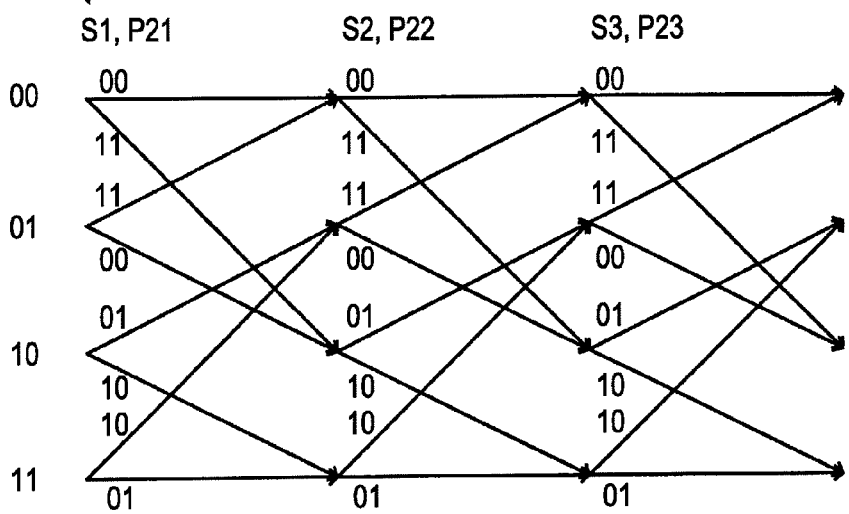
CALCULATE LIKELIHOOD ON THE BASIS OF COMBINATION
OF SYSTEMATIC BIT S AND PARITY BIT P2

FIG. 32
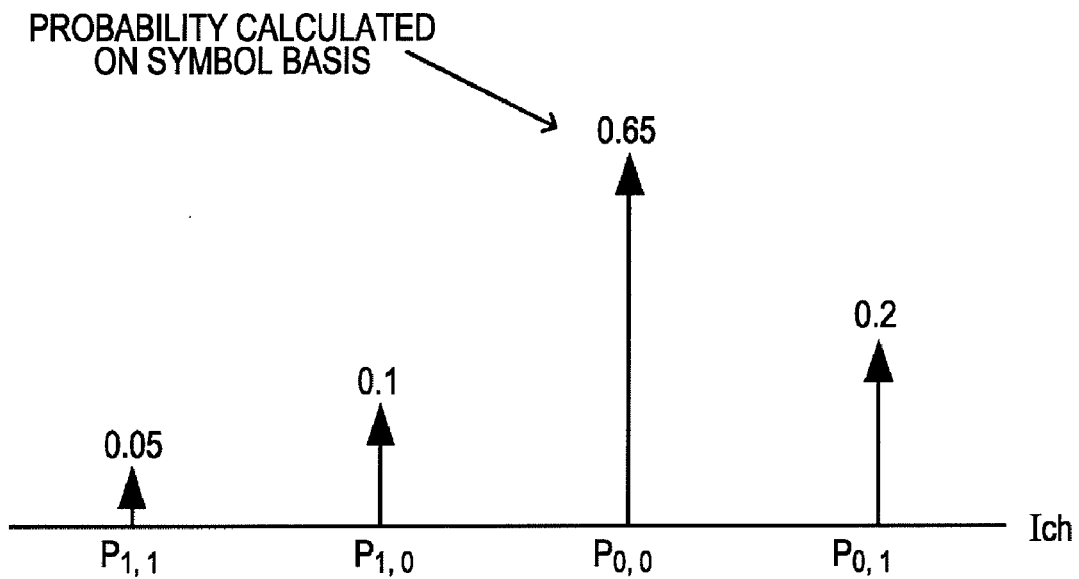
$P_{1,1}' = P_{1,L} \times P_{M,1} = 0.15 \times 0.25 = 0.0375$
$P_{1,0}' = P_{1,L} \times P_{M,0} = 0.15 \times 0.75 = 0.1125$
$P_{0,0}' = P_{0,L} \times P_{M,0} = 0.85 \times 0.75 = 0.6375$
$P_{0,1}' = P_{0,L} \times P_{M,1} = 0.85 \times 0.25 = 0.2125$

FIG. 33

| PROBABILITY | PROBABILITY CALCULATED ON BIT BASIS | PROBABILITY CALCULATED ON SYMBOL BASIS |
|---|---|---|
| PROBABILITY OF 1, 1 | 0.0375 | 0.05 |
| PROBABILITY OF 1, 0 | 0.1125 | 0.1 |
| PROBABILITY OF 0, 0 | 0.6375 | 0.65 |
| PROBABILITY OF 0, 1 | 0.2125 | 0.2 |

COMMUNICATION SYSTEM

CROSS-REFERENCE TO RELATED APPLICATION

This application is based upon and claims the benefit of priority of the prior Japanese Patent Application No. 2008-262612, filed on Oct. 9, 2008, the entire contents of which are incorporated herein by reference.

FIELD

The present invention relates to a communication system that performs encoding and decoding for communication.

BACKGROUND

In wireless communication, as a modulation method of superimposing information using a carrier wave having a constant frequency and transmitting the information, a high-order modulation method, such as 16QAM (quadrature amplitude modulation) or 64QAM, has been widely used.

The 16QAM is a modulation method of changing the phase and amplitude of the carrier wave into 16 states (transmission of 16 values once) and transmitting one symbol by 4 bits. The 64QAM is a modulation method of changing the phase and amplitude of the carrier wave into 64 states (transmission of 64 values once) and transmitting one symbol by 6 bits.

Large errors occur in received data due to fading (the level of an electric wave varies due to interference between the wavelengths of electric waves having a time difference therebetween) generated in a wireless transmission line, or thermal noise inside a communication device, which results in an increase in the transmission error ratio of information.

Therefore, in the wireless communication field, an error correction encoding/decoding technique is required which allows a receiver side to correct a transmission error. Error correction encoding gives redundancy to data intended to be transmitted, and data having an error is restored by the redundancy. That is, this redundancy enables to improve transmission quality.

As the error correction encoding, so-called convolution encoding that is effected by the input of previous information data when information data is encoded has been widely used. The transmitter side performs convolution encoding on information data intended to be transmitted, modulates the encoded data, and transmits the modulated data. The receiver side demodulates received data, calculates the likelihood (probability) of the demodulated data, and estimates information data having high likelihood.

The likelihood means the conditional probability of Y being transmitted in received data X. That is, the likelihood means the probability of Y being transmitted under the conditions that data X is received.

FIG. 31 is a diagram illustrating the constellation of 16QAM. In FIG. 31, the horizontal axis indicates Ich, and the vertical axis indicates Qch. In the 16QAM transmission, the information of one of 16 symbol points is transmitted, and ideally, a signal point of a received signal is matched with any one of the 16 symbol points. However, deviation occurs in the transmission line due to, for example, noise. Here, it is assumed that the received signal is disposed at a signal point A due to deviation.

FIG. 32 is a diagram illustrating the probability of an I component of the signal point A being each signal pattern of Ich. 2-bit signal patterns of Ich are (1, 1), (1, 0), (0, 0), and (0, 1), and a component of Ich of the signal point A is any one of the signal patterns (1, 1), (1, 0), (0, 0), and (0, 1).

In the coordinates of FIG. 31, (0, 0) is closest to the signal point A, followed by (0, 1), (1, 0), and (1, 1). When the probability of a signal point being disposed at $(x, y)$ is $P_{x,y}$, the probabilities of the I component of the signal point A being disposed at (0, 0), (0, 1), (1, 0), and (1, 1) are calculated as follows: $P_{1,1}=0.05$, $P_{1,0}=0.1$, $P_{0,0}=0.65$, and $P_{0,1}=0.2$ (the probability of the I component of the signal point A being disposed at (0, 0) is the highest, and the probability of the I component of the signal point A being disposed at (1, 1) is the lowest).

Then, 2 bits of the signal pattern of Ich are separated into MSB (most significant bit) and LSB (least significant bit), and the probability of the MSB and the probability of the LSB are calculated based on the calculated probability. The calculated results are combined with each other to calculate the probability of the I component of the signal point A being each signal pattern of Ich (the left bit of the Ich signal pattern is the MSB, and the right bit thereof is the LSB).

The MSB of the I component of the signal point A is 0 when the signal pattern is (0, 0) or (0, 1). Therefore, the probability $P_{0,L}$ of the MSB of the I component of the signal point A being 0 is the sum of the probability $P_{0,0}$ of the signal pattern being (0, 0) and the probability $P_{0,1}$ of the signal pattern being (0, 1) ($P_{0,L}=P_{0,0}+P_{0,1}=0.65+0.2=0.85$).

The MSB of the I component of the signal point A is 1 when the signal pattern is (1, 0) or (1, 1). Therefore, the probability $P_{1,L}$ of the MSB of the I component of the signal point A being 1 is the sum of the probability $P_{1,0}$ of the signal pattern being (1, 0) and the probability $P_{1,1}$ of the signal pattern being (1, 1) ($P_{1,L}=P_{1,0}+P_{1,1}=0.1+0.05=0.15$).

The LSB of the I component of the signal point A is 0 when the signal pattern is (0, 0) or (1, 0). Therefore, the probability $P_{M,0}$ of the LSB of the I component of the signal point A being 0 is the sum of the probability $P_{0,0}$ of the signal pattern being (0, 0) and the probability $P_{1,0}$ of the signal pattern being (1, 0) ($P_{M,0}=P_{0,0}+P_{1,0}=0.65+0.1=0.75$).

The LSB of the I component of the signal point A is 1 when the signal pattern is (0, 1) or (1, 1). Therefore, the probability $P_{M,1}$ of the LSB of the I component of the signal point A being 1 is the sum of the probability $P_{0,1}$ of the signal pattern being (0, 1) and the probability $P_{1,1}$ of the signal pattern being (1, 1) ($P_{M,1}=P_{0,1}+P_{1,1}=0.2+0.05=0.25$).

When the MSB is 1 and the LSB is 1, the I component of the signal point A is the signal pattern (1, 1) of Ich. Therefore, the probability $P_{1,1}'$ of the I component of the signal point A being the signal pattern (1, 1) of Ich is the product of the probability $P_{1,L}$ of the MSB being 1 and the probability $P_{M,1}$ of the LSB being 1 ($P_{1,1}'=P_{1,L}\times P_{M,1}=0.15\times 0.25=0.0375$).

When the MSB is 1 and the LSB is 0, the I component of the signal point A is the signal pattern (1, 0) of Ich. Therefore, the probability $P_{1,0}'$ of the I component of the signal point A being the signal pattern (1, 0) of Ich is the product of the probability $P_{1,L}$ of the MSB being 1 and the probability $P_{M,0}$ of the LSB being 0 ($P_{1,0}'=P_{1,L}\times P_{M,0}=0.15\times 0.75=0.1125$).

When the MSB is 0 and the LSB is 0, the I component of the signal point A is the signal pattern (0, 0) of Ich. Therefore, the probability $P_{0,0}'$ of the I component of the signal point A being the signal pattern (0, 0) of Ich is the product of the probability $P_{0,L}$ of the MSB being 0 and the probability $P_{M,0}$ of the LSB being 0 ($P_{0,0}'=P_{0,L}\times P_{M,0}=0.85\times 0.75=0.6375$).

When the MSB is 0 and the LSB is 1, the I component of the signal point A is the signal pattern (0, 1) of Ich. Therefore, the probability $P_{0,1}'$ of the I component of the signal point A being the signal pattern (0, 1) of Ich is the product of the probability $P_{0,L}$ of the MSB being 0 and the probability $P_{M,1}$ of the LSB being 1 ($P_{0,1}'=P_{0,L}\times P_{M,1}=0.85\times 0.25=0.2125$).

FIG. 33 is a diagram illustrating the probability calculated on a bit basis and the probability calculated on a symbol basis, and illustrates the calculated probabilities as a table. As can be seen from FIG. 33, a composite probability of the probabilities calculated by separating each bit (the probability calculated on a bit basis) is different from a conventional probability (the probability calculated on a symbol basis). This means that, when the bits are separated with independent probabilities, information between the bits is lost.

In bit-based decoding, likelihood is calculated in the bit unit of the received signal. However, in error correction encoding, such as convolution encoding, information to be transmitted and a redundant bit are associated with each other. Therefore, when the receiver side calculates likelihood on a bit basis while completely separating the bits, as illustrated in FIG. 33, information between the bits is lost, which results in deterioration of characteristics (an increase in error ratio).

Therefore, the transmitter side does not perform convolution encoding on a bit basis, but performs convolution encoding on a symbol basis. The receiver side performs decoding on a symbol basis and calculates likelihood on a symbol basis. In this case, it is possible to prevent the loss of information between the bits.

A representative example of the convolution encoding technique is turbo encoding (turbo codes), which is used as a 3GPP (3rd generation partnership project) wireless communication error correction mechanism. In the turbo encoding/decoding, in order to prevent deterioration of characteristics, symbol-based encoding/decoding is performed.

As a turbo encoding technique, a technique for reducing memory usage has been proposed (for example, see Japanese Patent Application Laid-Open No. 2008-141312). In addition, a technique has been proposed which prevents deterioration of a demodulating performance without increasing interference power (for example, see Japanese Patent Application Laid-Open No. 2004-297182). Further, a technique has been proposed which improves an error correction performance using determination reliability during demodulation according to bit mapping in high-order QAM (see Japanese Patent Application Laid-Open No. 2002-344548).

In the symbol-based turbo encoding/decoding according to the related art, the transmitter side performs symbol-based turbo encoding to generate encoded data, maps the encoded data to I and Q components of the modulation method, and transmits the data. The receiver side demodulates the received data on a symbol basis, calculates the likelihood of the demodulated data on a symbol basis, and decodes the data.

As described above, in the symbol-based decoding, when a symbol is divided into bits, information between the bits is lost. Therefore, the likelihood is calculated without breaking the symbol. However, a symbol-based likelihood calculating method stores a symbol pattern. Therefore, the symbol-based likelihood calculating method has a problem in that storage capacity increases, as compared to a bit-based likelihood calculating method.

In addition, as the number of multiple values in the modulate method is increased, the number of patterns to be stored is exponentially increased. Therefore, the symbol-based turbo encoding/decoding causes an increase in circuit size.

Meanwhile, when the symbol-based turbo encoding is performed, symbol-based interleaving is performed. When the bit-based turbo encoding is performed, bit-based interleaving is performed. However, the symbol-based turbo encoding has a problem in that capability to arrange data at random (random property) is lowered, as compared to the bit-based turbo encoding. As a result, in the symbol-based turbo encoding, characteristics deteriorate.

SUMMARY

According to an aspect of the embodiment discussed herein, a communication system that performs encoding and decoding for communication includes a transmitting apparatus and a receiving apparatus. The transmitting apparatus includes a turbo encoding unit including a first encoding unit that encodes an input signal and generates a first parity bit by bit-based encoding and n (n=1, 2, 3, . . . ) second encoding units that encode the input signal and generate second parity bits by bit-based encoding, and a symbol mapping unit that maps an output from the turbo encoding unit to a symbol by bit-based mapping operation and modulates the output. And the receiving apparatus includes a demodulating unit that demodulates a transmission signal, and a turbo decoding unit that performs turbo decoding on the demodulated signal by bit-based decoding.

BRIEF DESCRIPTION OF DRAWINGS

FIG. 22 is a trellis diagram illustrating the operation of the turbo decoding unit.

FIG. 32 is a diagram illustrating the probability of an I component at a signal point being each signal pattern of Ich; and FIG. 33 is a diagram illustrating the probability calculated on a bit basis and the probability calculated on a symbol basis.

DESCRIPTION OF EMBODIMENT

Figure 1:
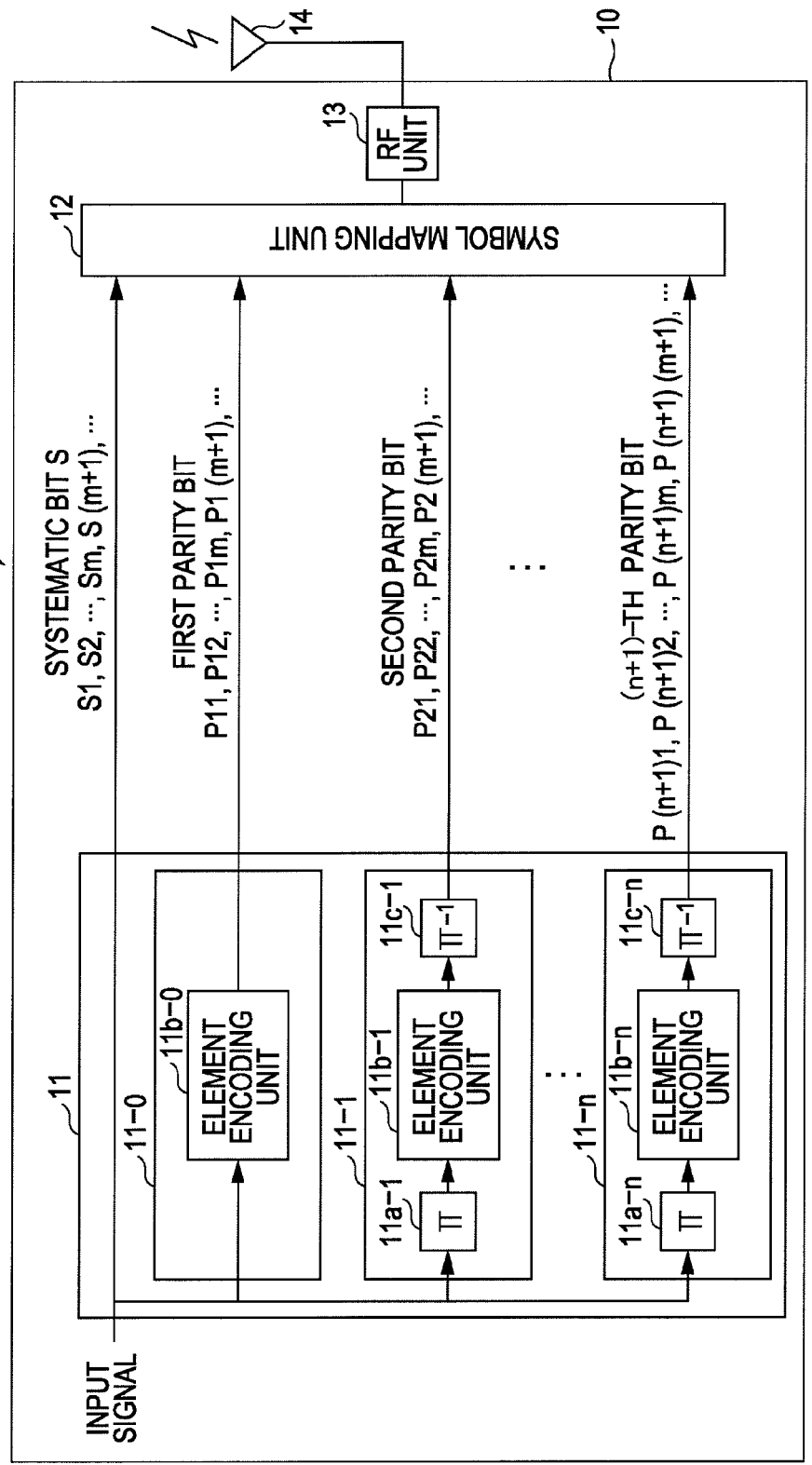
FIG. 1 is a diagram illustrating a communication system.
Figure 2:
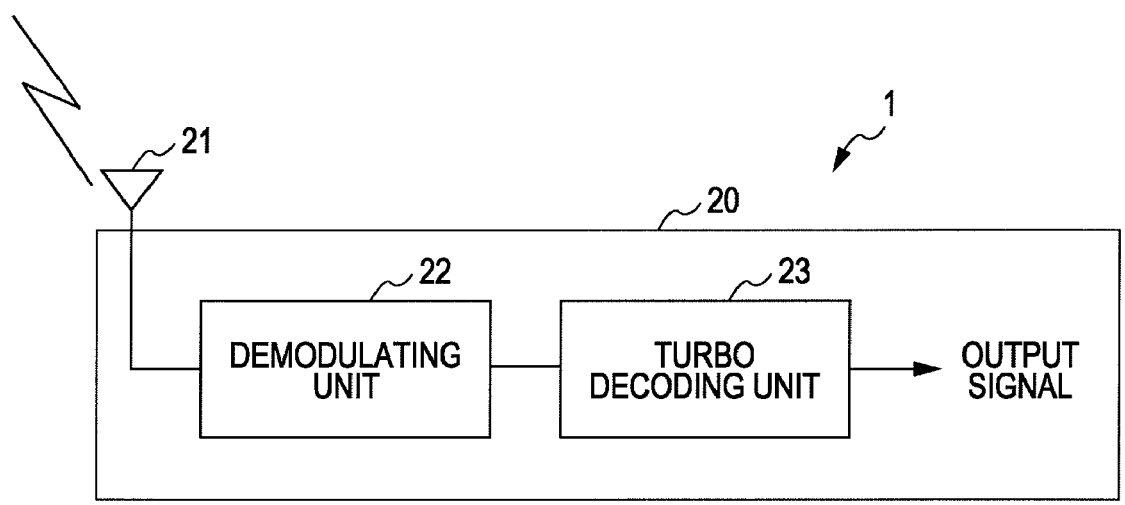
FIG. 2 is a diagram illustrating the communication system.

Hereinafter, a communication system according to an embodiment of the invention will be described with reference to the accompanying drawings. FIGS. 1 and 2 are diagrams illustrating the communication system. The communication system 1 includes a transmitting apparatus 10 and a receiving apparatus 20, and performs error correction encoding/decoding for communication.

The transmitting apparatus 10 includes a turbo encoding unit 11, a symbol mapping unit 12, an RF (radio frequency) unit 13, and an antenna 14, and the receiving apparatus 20 includes an antenna 21, a demodulating unit 22, and a turbo decoding unit 23.

In the transmitting apparatus 10, the turbo encoding unit 11 includes an encoding unit 11-0, which is a first encoding unit, and encoding units 11-1 to 11-$n$ (n=1, 2, . . . ), which are second encoding units. The encoding unit 11-0 includes an element encoding unit 11$b$-0, and the encoding unit 11-$n$ (n=1, 2, . . . ) includes an interleaver 11$a$-$n$, an element encoding unit 11$b$-$n$, and a deinterleaver 11$c$-$n$.

The element encoding unit 11$b$-0 of the encoding unit 11-0 performs convolution encoding on an input signal, and outputs the encoded result as a parity bit P1 (first parity bit).

The interleaver 11$a$-$n$ of the encoding unit 11-$n$ interleaves the input signal to rearrange the order of the input signal on a bit basis. The element encoding unit 11$b$-$n$ performs convolution encoding on the interleaved input signal. The deinterleaver 11$c$-$n$ deinterleaves the convolutionally encoded signal on a bit basis, and outputs the deinterleaved result as a parity bit P(n+1) (second parity bit).

The turbo encoding unit 11 outputs one systematic bit S, which is a signal bit output of the input signal, one parity bit P1, and n parity bits P2 to P(n+1).

The symbol mapping unit 12 maps the output of the turbo encoding unit 11 to a symbol, thereby modulating the output. The RF unit 13 up-converts the output of the symbol mapping unit 12 into an RF frequency, and outputs the RF frequency through the antenna 14.

In the receiving apparatus 20, the antenna 21 receives a transmission signal from the transmitting apparatus 10, and the demodulating unit 22 down-converts the transmission signal into a baseband frequency. The turbo decoding unit 23 performs turbo decoding on the demodulated signal.

Figure 3:
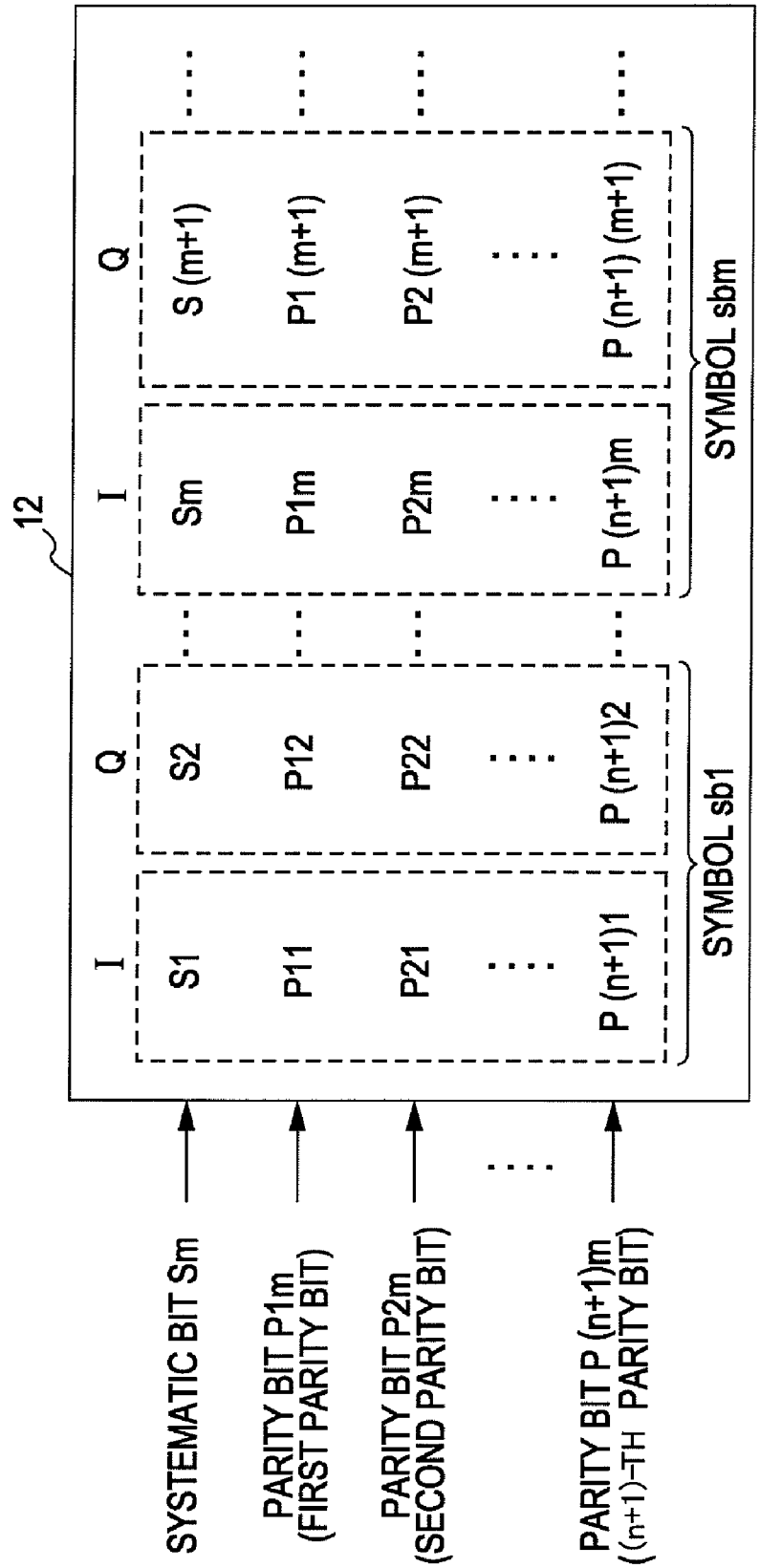
FIG. 3 is a diagram illustrating a symbol mapping operation.

FIG. 3 is a diagram illustrating a symbol mapping operation. An m-th (m=1, 2, 3, . . . ) systematic bit output from the turbo encoding unit 11 is referred to as a systematic bit Sm, an m-th output parity bit P1 is referred to as a parity bit P1$m$, and an m-th output parity bit P(n+1) is referred to as a parity bit P(n+1)m.

The symbol mapping unit 12 maps the m-th systematic bit Sm, and the m-th parity bits P1$m$ to P(n+1)m to a symbol of one of an I component and a Q component, and maps an (m+1)-th systematic bit Sm+1, and (m+1)-th parity bits P1($m$+1) to P(n+1)(m+1) to a symbol of the other of the I and Q components.

Specifically, for example, for a first symbol (which is referred to as a symbol sb1), (S1, P11, P21, . . . , P(n+1)1) are mapped to MSB to LSB of an I component of the symbol sb1 in this order, and (S2, P12, P22, . . . , P(n+1)2) are mapped to MSB to LSB of a Q component of the symbol sb1.

For the last symbol (which is referred to as a symbol sbm), (Sm, P1$m$, P2$m$, . . . , P(n+1)m) are mapped to MSB to LSB of an I component of the symbol sbm in this order, and (S(m+1), P1($m$+1), P2($m$+1), . . . , P(n+1)(m+1)) are mapped to MSB to LSB of a Q component of the symbol sbm.

Before the structure and operation of the communication system 1 is described, the problems to be solved and the basic concept of convolution encoding and interleaving will be described in detail. The detailed structure of the communication system 1 will be described after FIG. 16.

Figure 4:
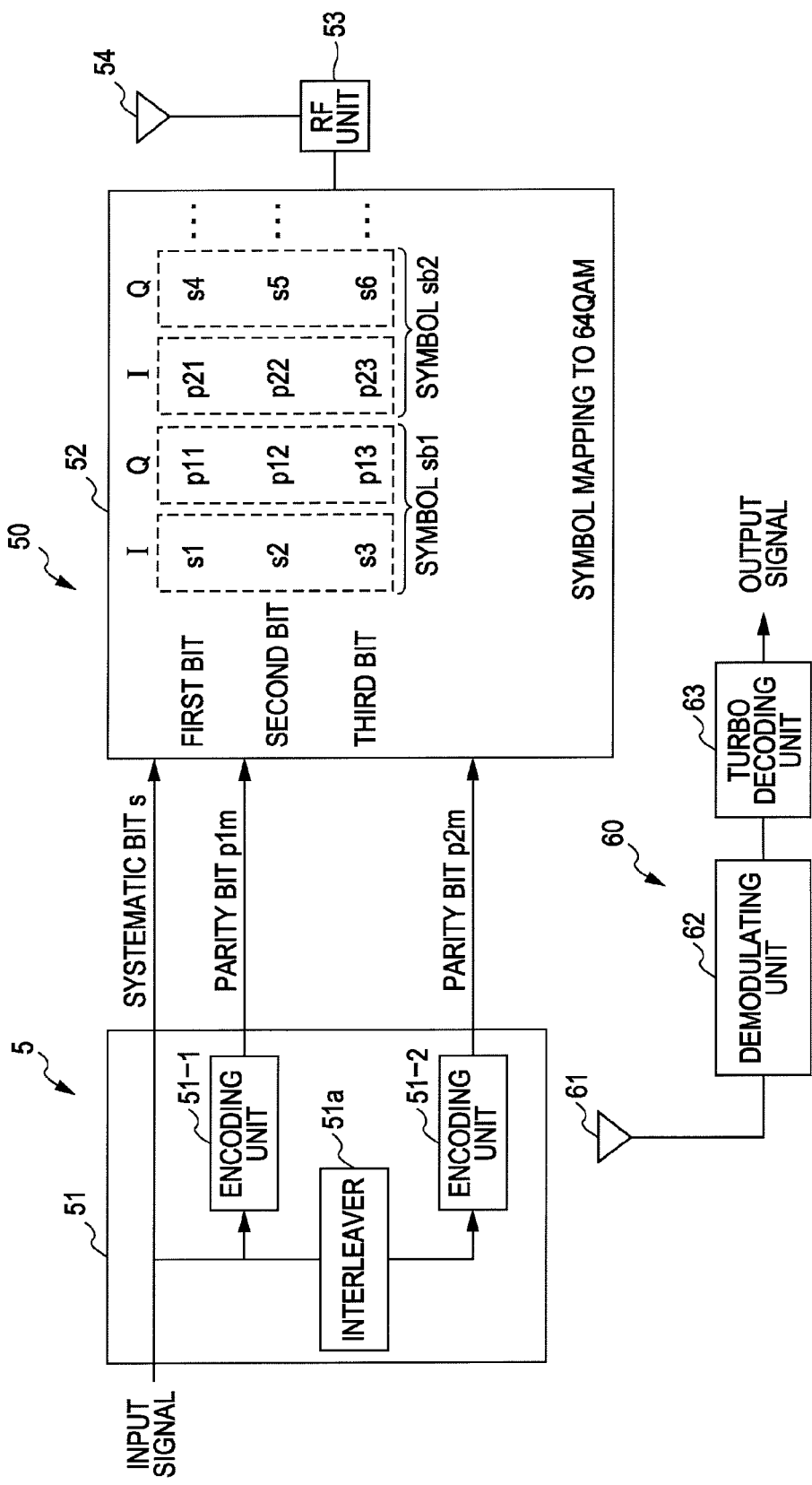
FIG. 4 is a diagram illustrating the structure of the communication system.

FIG. 4 is a diagram illustrating the structure of a communication system according to the related art. The communication system performs symbol-based turbo encoding to generate encoded data, maps the encoded data to I and Q components of 64QAM to obtain data, and transmits or receives the data.

A communication system 5 includes a transmitting apparatus 50 and a receiving apparatus 60. The transmitting apparatus 50 includes a turbo encoding unit 51, a symbol mapping unit 52, an RF unit 53, and an antenna 54. The turbo encoding unit 51 includes encoding units 51-1 and 51-2 and an interleaver 51$a$. The encoding units 51-1 and 51-2 generally have the same internal structure. The receiving apparatus 60 includes an antenna 61, a demodulating unit 62, and a turbo decoding unit 63.

In the transmitting apparatus 50, the encoding unit 51-1 performs convolution encoding on an input signal and outputs a parity bit p1$m$. The interleaver 51$a$ interleaves the input signal to rearrange the order thereof on a symbol basis.

The encoding unit 51-2 performs convolution encoding on the interleaved input signal and outputs a parity bit p2$m$. The turbo encoding unit 51 outputs a systematic bit s and the parity bits p1$m$ and p2$m$.

The symbol mapping unit 52 maps the systematic bit s and the parity bits p1$m$ and p2$m$ to I and Q components of 64QAM. The RF unit 53 up-converts the output of the symbol mapping unit 52 into an RF frequency, and outputs the RF frequency through the antenna 54.

In the receiving apparatus 60, the demodulating unit 62 down-converts a transmission signal received by the antenna 61 into a baseband frequency and demodulates the signal on a symbol basis. The turbo decoding unit 63 performs a symbol-based turbo decoding process.

Figure 5:
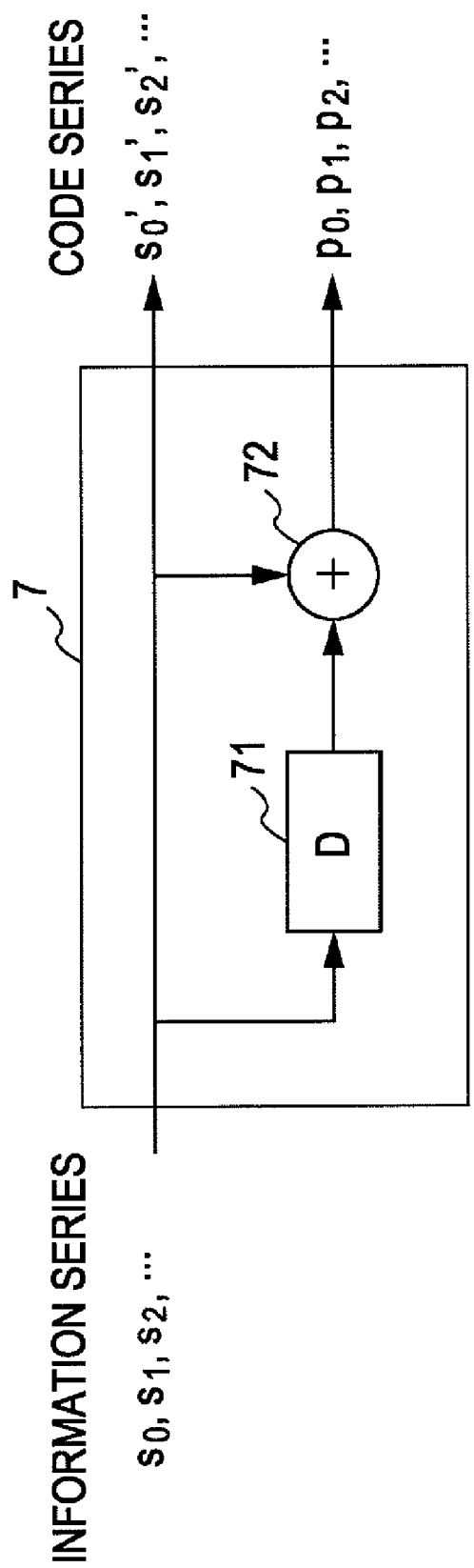
FIG. 5 is a diagram illustrating the concept of convolution encoding.

Before the operation of the communication system 5 is described, the outline of convolution encoding and the outline of interleaving will be described. FIG. 5 is a diagram illustrating the concept of convolution encoding. A convolution encoding unit 7 includes a delay element 71 and an adder 72. FIG. 5 illustrates an example of the convolution encoding unit including a delay element (shift register) of a one unit time and an adder in order to describe convolution encoding.

When a k-bit information block input at a time t (t=0, 1, 2, ... ) is $s_t=(s_{t1}, s_{t2}, \ldots, s_{tk})$ and an n-bit code block output at the time t is $w_t=(w_{t1}, w_{t2}, \ldots, w_{tn})$, a series of information blocks $s_{t1}, s_{t2}, \ldots, s_{tk}$ is referred to as an information series and a series of code blocks $w_{t1}, w_{t2}, \ldots, w_{tn}$ is referred to as a code series.

In the convolution encoding, the code block $w_t$ is not determined by only the current information block $s_t$, but the code block $w_t$ is determined by the current information block and K previous information blocks $s_t, s_{t-1}, \ldots, s_{t-K+1}$.

The information bit $s_t$ is input to the convolution encoding unit 7 at the time t, and a code bit $s_t'$ and a code bit $p_t$ are output from the convolution encoding unit 7. The code bit $s_t'$ is the information bit $s_t$, and the code bit $p_t$ is the sum of an information bit that is currently input and a previous information bit thereof, from the structure of the convolution encoding unit 7.

Therefore, as the convolution encoding operation, the following two equations are established:

$$s_t'=s_t, \quad (1a)$$

$$p_t=s_t+s_{t-1} \quad (1b)$$

In the equation 1b, "+" indicates the addition of mod 2 (that is, 0+0=0, 0+1=1, 1+0=1, 1+1=0).

Figure 6:
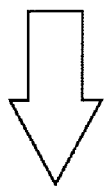
FIG. 6 is a diagram illustrating an example of a convolution encoding operation.

FIG. 6 is a diagram illustrating an example of the convolution encoding. A code series ($s_t'$, $p_t$) when the information bit $s_t$ is input is as follows from the equations 1a and 1b: when $s_0=0$, ($s_0'$, $p_0$)=(0, 0); when $s_1=1$, ($s_1'$, $P_1$)=(1, 1); when $s_2=1$, ($s_2'$, $p_2$)=(1, 0); when $s_3=1$, ($s_3'$, $p_3$)=(1, 0); when $s_4=0$, ($s_4'$, $p_4$)=(0, 1); and when $s_5=1$, ($s_5'$, $p_5$)=(1, 1), . . . .

As such, in the convolution encoding illustrated in FIG. 5, among the code bit outputs, $p_t$ is determined by both the information bit $s_t$ at the current time and the previous information bit $s_{t-1}$. Therefore, the convolution encoding is a series of codes in which an information bit and a redundant bit (test bit) are associated with each other.

In the turbo encoding, as illustrated in FIG. 4, the interleaver 51a is inserted between two encoding units 51-1 and 51-2 for convolution encoding. Therefore, the two encoding units independently generate code series.

Figure 7:
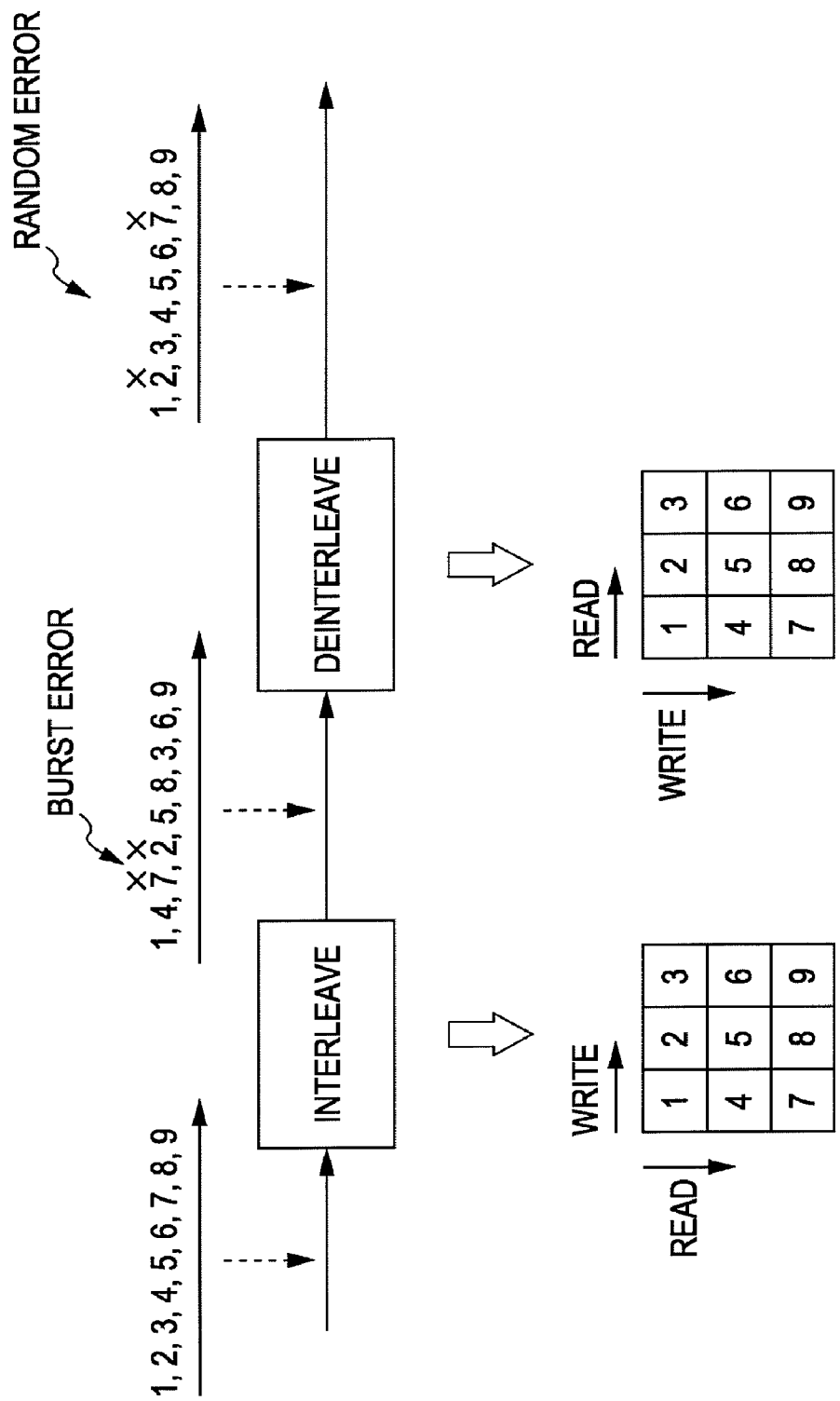
FIG. 7 is a diagram illustrating the outline of interleaving.

Next, the outline of interleaving will be described. FIG. 7 is a diagram illustrating the outline of interleaving, and illustrates an example of an interleaving method. It is assumed that data is input to the interleaver in the order of 1, 2, 3, . . . , 9.

The interleaver writes data in the row direction of a matrix of, for example, n rows and m columns, reads data in the column direction, and outputs the read data. After data is output, a burst error continuously occurs in a wireless transmission line due to the influence of fading. In FIG. 7, it is assumed that 7 and 2 include the burst error.

The deinterleaver of the receiver side performs an operation (deinterleaving) opposite to that of the transmitter side. That is, the deinterleaver writes data in the column direction and reads data in the row direction to obtain a series of original data. As a result, the order of data is restored to the order during transmission, but the error data 2 and 7 are disposed at random.

In the convolution encoding, when error data is generated at random, it is possible to correct the error data, but it is difficult to sufficiently correct the burst error. Therefore, the above-mentioned interleaving is performed.

Next, a symbol mapping operation will be described with reference to FIG. 4 again. The systematic bit sm and the parity bits p1m and p2m are output from the turbo encoding unit 51, and the data thereof is input to the symbol mapping unit 52. In addition, sm indicates an m-th output systematic bit, p1m indicates an m-th output parity bit p1, and p2m indicates an m-th output parity bit p2.

In this embodiment, the symbol mapping unit 52 performs 64QAM, and performs symbol-based mapping in which one symbol is 6 bits. That is, the symbol mapping unit 52 maps 3 bits to an I component and maps 3 bits to a Q component. In addition, it is assumed that, in each of the I component and the Q component, the first bit is MSB, a second bit is an intermediate bit, and a third bit is LSB.

In the symbol mapping process according to the related art, for a first symbol (which is referred to a symbol sb1), systematic bits (s1, s2, s3) are mapped to MSB, the intermediate bit, and LSB of the I component of the symbol sb1, respectively, and parity bits p1(p11, p12, p13) are mapped to MSB, the intermediate bit, and LSB of the Q component of the symbol sb1, respectively.

For the next symbol (which is referred to as a symbol sb2), parity bits p2(p21, p22, p23) are mapped to MSB, the intermediate bit, and LSB of the I component of the symbol sb2, respectively, and systematic bits (s4, s5, s6) are mapped to MSB, the intermediate bit, and LSB of the Q component of the symbol sb2, respectively. Similarly, mapping is performed on the subsequent symbols.

Figure 8:
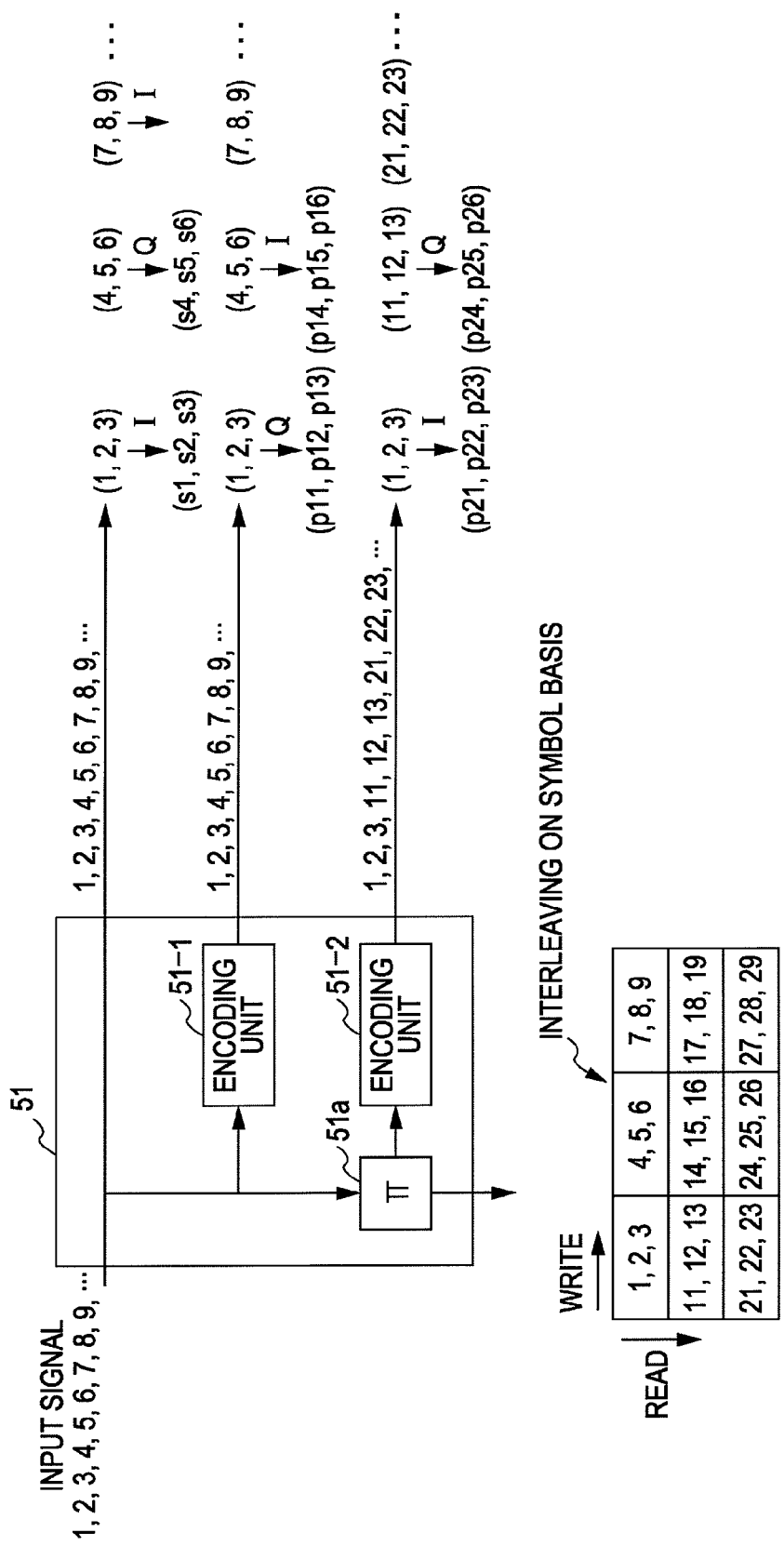
FIG. 8 is a diagram illustrating the output state of a turbo encoding unit.

FIG. 8 is a diagram illustrating the output state of the turbo encoding unit 51. It is assumed that input signals 1, 2, 3, . . . are input to the turbo encoding unit 51. When the signals are input, the systematic bits s=(1, 2, 3, . . . ) are output. In addition, the encoding unit 51-1 performs convolution encoding on the input signals 1, 2, 3, . . . and outputs a parity bits p1=(1, 2, 3, . . . ).

The interleaver 51a interleaves the input signals 1, 2, 3, . . . on a symbol basis. For example, when sets of three data items (1, 2, 3), (4, 5, 6), (7, 8, 9), . . . are input in this order, sets of three data items (1, 2, 3), (11, 12, 13), (21, 22, 23), . . . are output in this order. Therefore, the encoding unit 51-2 outputs a parity bits p2=[(1, 2, 3), (11, 12, 13), (21, 22, 23), . . . ].

Then, the symbol mapping unit 52 maps the systematic bit s=(1, 2, 3) as (s1, s2, s3) to the I component, and maps the parity bit p1=(1, 2, 3) as (p11, p12, p13) to the Q component.

Then, the symbol mapping unit 52 maps the next parity bit p2=(1, 2, 3) as (p21, p22, p23) to the I component and maps the next systematic bit s=(4, 5, 6) as (s4, s5, s6) to the Q component. This operation is repeatedly performed on the subsequent bits.

As described above, in the symbol-based mapping operation according to the related art, a set of only the systematic bits s, a set of only the parity bits p1, or a set of only the parity bits p2 is mapped to the I component of one symbol.

Similarly, a set of only the systematic bits s, a set of only the parity bits p1, or a set of only the parity bits p2 is mapped to the Q component (in addition, in the bit-based mapping operation, a mixture of the systematic bits and the parity bits is mapped to each of the I and Q components).

Figure 9:
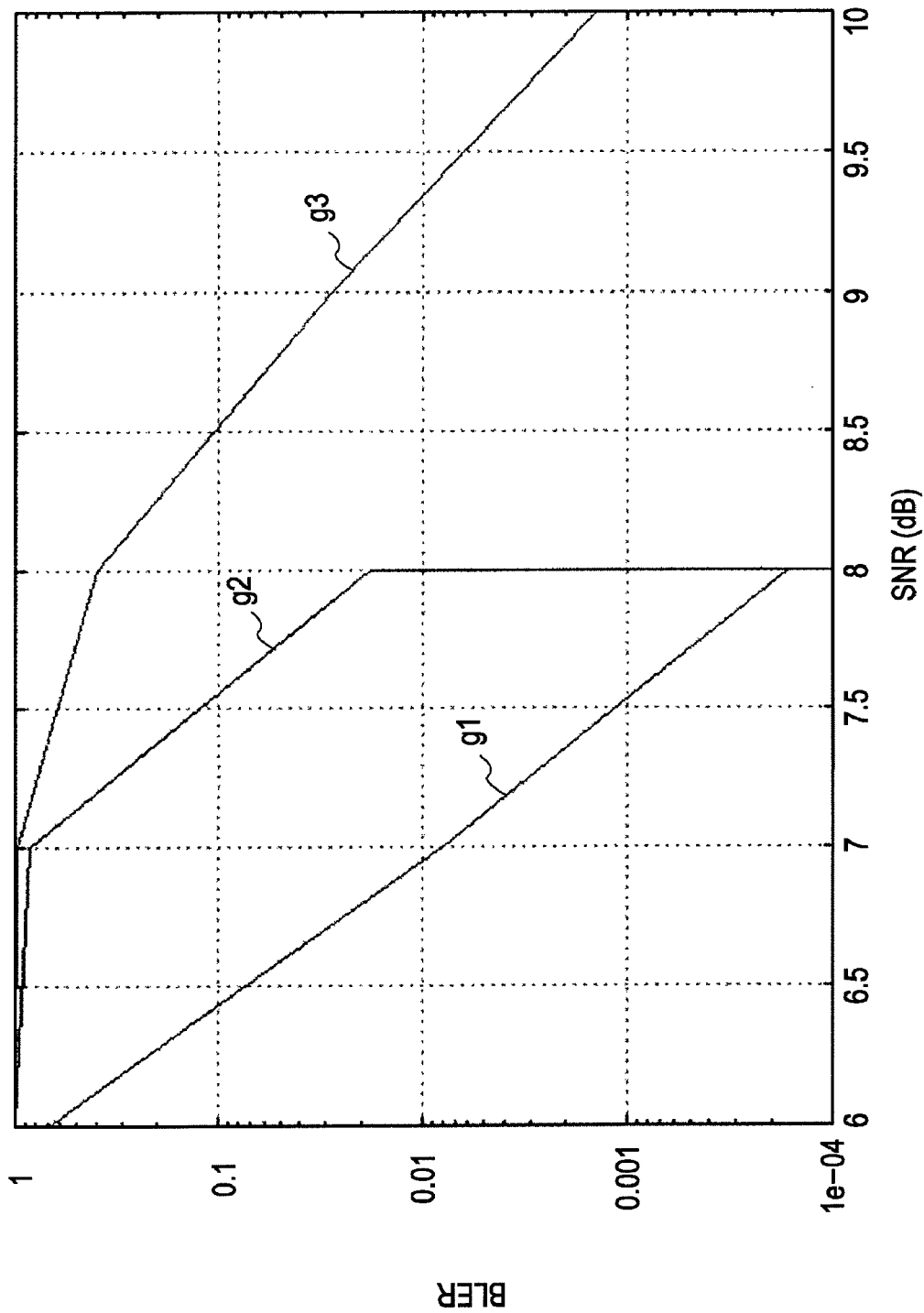
FIG. 9 is a diagram illustrating turbo encoding/decoding characteristics.

Next, the difference in characteristics between the symbol-based turbo encoding process and the bit-based turbo encoding process will be described. FIG. 9 is a diagram illustrating the characteristics of turbo encoding/decoding. In FIG. 9, the horizontal axis indicates SNR (signal-to-noise ratio) and the vertical axis indicates BLER (block error ratio), which is an index of an error ratio.

A graph g1 indicates the characteristics of the communication system 5 illustrated in FIG. 4 when encoding and decoding are performed on a symbol basis. A graph g2 indicates the characteristics of the communication system 5 when encoding and decoding are performed on a bit basis. A graph g3 indicates the characteristics of the communication system 5 when encoding is performed on a symbol basis and decoding is performed on a bit basis.

The graph g1 has the best characteristics (BLER is low), followed by the graph g2 and the graph g3 in this order. For example, in order to obtain a BLER of 0.01, SNR is 6.9 in the graph g1. However, in the graph g2, an SNR of 8 is needed, and in the graph g3, an SNR of 9.3 is needed.

As can be seen from FIG. 9, among the three characteristics, the symbol-based turbo encoding/decoding process represented by the graph 1 may reduce the BLER to 0.01 at the lowest SNR. In this case, it is possible to obtain the best characteristics.

As comparing the graph g2 (encoding and decoding are both performed on a bit basis) with the graph g3 (encoding is performed on a symbol basis, and decoding is performed on a bit basis), the graph g2 has the better characteristics.

The reason is as follows: the bit-based turbo encoding has a good random property since interleaving is performed on a bit basis, but the symbol-based turbo encoding has a random property lower than bit-based interleaving, since interleaving is performed on a symbol basis (a set of a plurality of bits).

As such, the symbol-based encoding/decoding may prevent the loss of information between bits, but has a problem in that the random property deteriorates, resulting in deterioration of characteristics.

Figure 10:
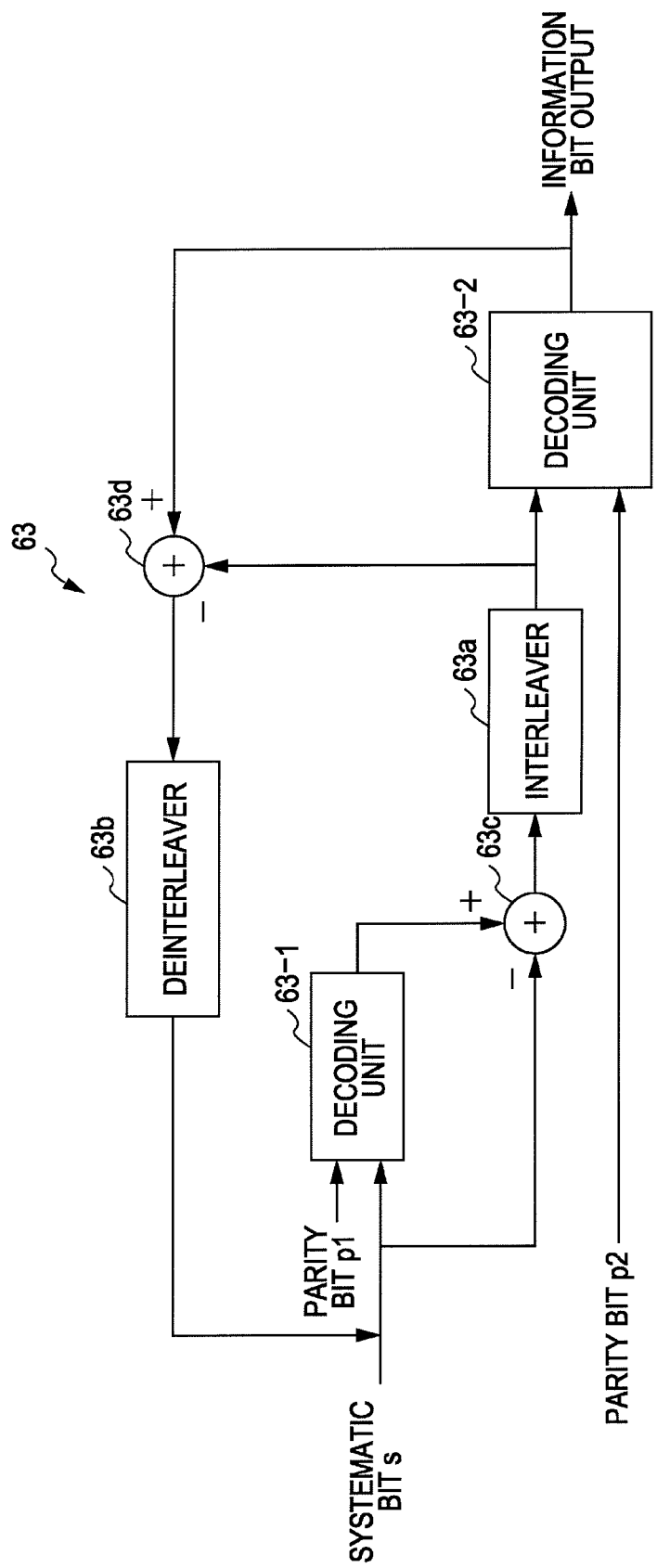
FIG. 10 is a diagram illustrating the structure of a turbo decoding unit.

Next, turbo decoding will be described. FIG. 10 is a diagram illustrating the structure of the turbo decoding unit 63. The turbo decoding unit 63 includes decoding units 63-1 and 63-2, an interleaver 63a, a deinterleaver 63b, and arithmetic units 63c and 63d.

The structure illustrated in FIG. 10 is based on an algorithm called MAP (maximum a posteriori). The output of each element (arrow in FIG. 10) indicates likelihood. For example, in FIG. 10, the parity bit p1 and the systematic bit s are illustrated as inputs to the decoding unit 63-1, but the likelihood of the parity bit p1 and the likelihood of the systematic bit s are input to the decoding unit 63-1.

Received code data composed of the systematic bit s and the parity bit p1 is input to the decoding unit 63-1, and the decoding unit 63-1 outputs the determination value of the likelihood of the systematic bit s that is estimated to have high likelihood. The arithmetic unit 63c extracts the likelihood of the systematic bit s from the determination value, and the interleaver 63a interleaves the output from the arithmetic unit 63c.

The output of the interleaver 63a and the parity bit p2 are input to the decoding unit 63-2, and the decoding unit 63-2 performs decoding and outputs the likelihood of the systematic bit s that is estimated to have high likelihood as a determination value. The arithmetic unit 63d extracts the output of the interleaver 63a from the determination value, and the deinterleaver 63b deinterleaves the output from the arithmetic unit 63d. The output of the deinterleaver 63b is input to the decoding unit 63-1 again.

As such, the turbo decoding process repeatedly performs decoding while feeding back the output to improve the effect of code correction. Therefore, the error that has been not corrected by one decoding operation is dispersed by the interleaver 63a. In this way, the error is corrected.

Figure 11:
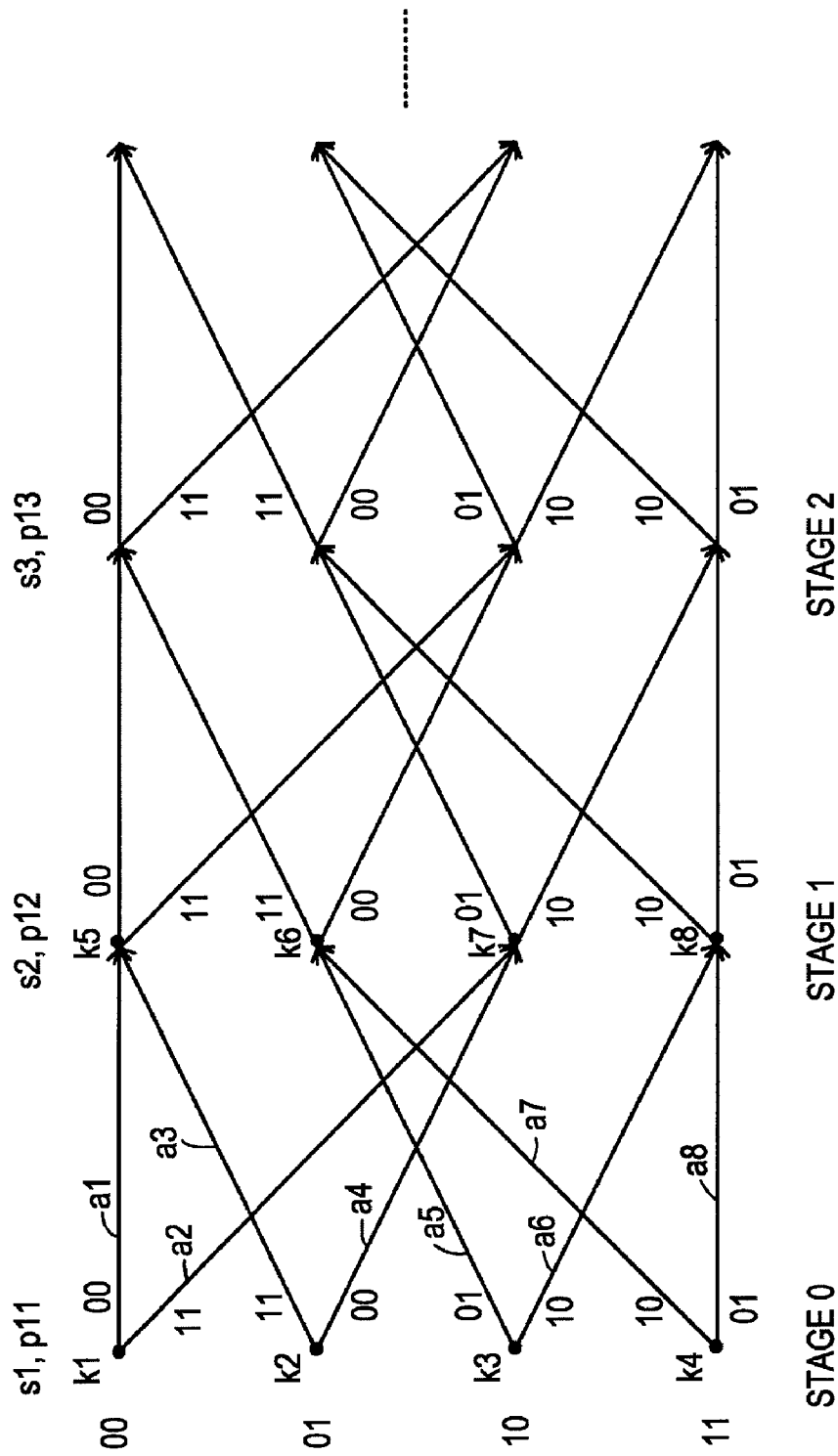
FIG. 11 is a trellis diagram illustrating the operation of a decoding unit.

Next, the operation of the decoding units 63-1 and 63-2 will be described with reference to a trellis diagram. FIG. 11 is a trellis diagram illustrating the operation of the decoding unit 63-1. It is assumed that bit-based decoding is performed.

In the trellis diagram, the vertical direction indicates the state of the decoding unit 63-1. The decoding unit 63-1 has four states, which are referred to as 00, 01, 10, and 11. In the trellis diagram, the horizontal direction indicates the transition of a stage. For example, in a stage 0, a set (Sm, p1m) of the systematic bit s and the parity bit p1 is (s1, p11). In a stage 1, (sm, p1m) is (s2, p12).

In the trellis diagram, a value (xy) on an arrow indicates the value of the next stage of (sm, p1m). For example, "00" on an arrow a1 indicates the case in which (s1, p11) at a lattice point k1 is transferred to (0, 0) in the next stage (in this case, (s1, p11) is transferred to a lattice point k5 by the arrow a1).

An example of a method of calculating the likelihood will be described with reference to the trellis diagram. An example of calculating the likelihood of (s2, p12) at the lattice point k5 is considered. In order to dispose (s2, p12) at the lattice point k5, (s1, p11) disposed at the lattice point k1 is transferred to the lattice point k5 by the arrow a1, or (s1, p11) disposed at a lattice point k2 is transferred to the lattice point k5 by an arrow a3 (actually, backward likelihood is also considered. However, for simplicity of explanation, in this embodiment, only the calculation of forward likelihood is performed. A method of calculating the forward and backward likelihoods will be described below).

When (s1, p11) is disposed at the lattice point k1 and s1 and p11 are 0, (s1, p11) is transferred from the lattice point k1 to the lattice point k5. If the likelihood when (s1, p11) is disposed at the lattice point k1 is $P_{k1}$ and the likelihood of s1 being 0 is $P_{s1=0}$, and the likelihood of p11 being 0 is $P_{p11=0}$, the likelihood of (s1, p11) being transferred from the lattice point k1 to the lattice point k5 is $P_{k1} \cdot P_{s1=0} \cdot P_{p11=0}$.

When (s1, p11) is disposed at the lattice point k2 and s1 and p11 are 1, (s1, p11) is transferred from the lattice point k2 to the lattice point k5. If the likelihood when (s1, p11) is disposed at the lattice point k2 is $P_{k2}$ and the likelihood of s1 being 1 is $P_{s1=1}$, and the likelihood of p11 being 1 is $P_{p11=1}$, the likelihood of (s1, p11) being transferred from the lattice point k2 to the lattice point k5 is $P_{k2} \cdot P_{s1=1} \cdot P_{p11=1}$.

Therefore, the likelihood $P_{k5}$ when (s2, p12) is disposed at the lattice point k5 is calculated as follows: $P_{k5} = (P_{k1} \cdot P_{s1=0} \cdot P_{p11=0}) + (P_{k2} \cdot P_{s1=1} \cdot P_{P11=1})$. The likelihoods of the positions of the other lattice points are also calculated by the above-mentioned algorithm.

Here, the likelihood of the systematic bit s1 being 0 or 1 is considered. The likelihood of the systematic bit s1 being 0 is any one of the likelihood of (s1, p11) being transferred from the lattice point k1 to the lattice point k5 (arrow a1), the likelihood of (s1, p11) being transferred from the lattice point k2 to a lattice point k7 (arrow a4), the likelihood of (s1, p11) being transferred from the lattice point k3 to a lattice point k6 (arrow a5), and the likelihood of (s1, p11) being transferred from a lattice point k4 to a lattice point k8 (arrow a8). Therefore, the sum of the four likelihoods is 0 ($Pr_{s1=0}$).

In addition, the likelihood of the systematic bit s1 being 1 is any one of the likelihood of (s1, p11) being transferred from the lattice point k1 to the lattice point k7 (arrow a2), the likelihood of (s1, p11) being transferred from the lattice point k2 to the lattice point k5 (arrow a3), the likelihood of (s1, p11) being transferred from the lattice point k3 to the lattice point k8 (arrow a6), and the likelihood of (s1, p11) being transferred from the lattice point k4 to the lattice point k6 (arrow a7). Therefore, the sum of the four likelihoods is 1 ($Pr_{s1=1}$).

Therefore, the likelihood $P_{s1=0}$ of the systematic bit s1 being 0 is compared with the likelihood $P_{s1=1}$ of the systematic bit s1 being 1, and the likelihood having a larger value is selected (if $Pr_{s1=0} > Pr_{s1=1}$, it is determined that the systematic bit s1 is 0). The same calculation as described above is repeatedly performed to the other systematic bits sm to determine the likelihood.

Figure 12:
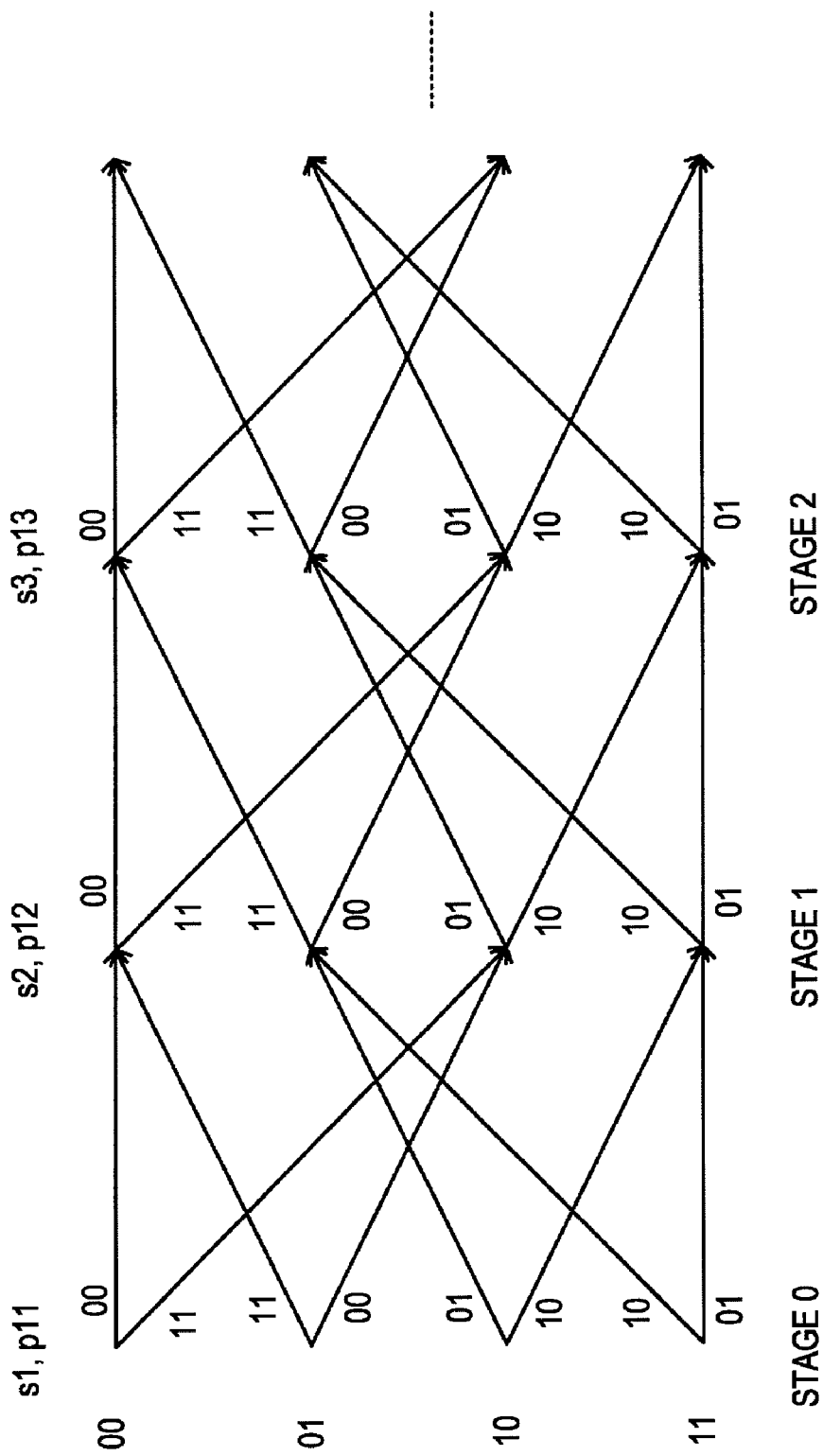
FIG. 12 is a trellis diagram illustrating the operation of the decoding unit.

FIG. 12 is a trellis diagram illustrating the operation of the decoding unit 63-2. The basic operation of the decoding unit 63-2 is the same as that of the decoding unit 63-1. The systematic bit determined by the decoding unit 63-1 is interleaved and is then input to the decoding unit 63-2. The decoding unit 63-2 uses the systematic bit determined by the decoding unit 63-1 to calculate a systematic bit from a code word composed of the systematic bit and the input parity bit p2 based on the same algorithm as described above.

The systematic bit calculated by the decoding unit 63-2 is deinterleaved and is then input to the decoding unit 63-1 again. Then, the decoding unit 63-1 calculates a systematic bit from a code word composed of the systematic bit calculated by the decoding unit 63-2 and the input parity bit p1.

As such, the likelihood of the systematic bit is calculated while the systematic bit is circulating through the decoding units 63-1 and 63-2. Therefore, the accuracy of calculation is improved, and a systematic bit having high likelihood is calculated. The number of circulations is predetermined to N. For example, when the probability of the systematic bit s1 being 0 calculated by an N-th calculating operation is 0.8 and the probability of the systematic bit s1 being 1 is 0.2, the systematic bit s1 is finally determined to be 0.

Figure 13:
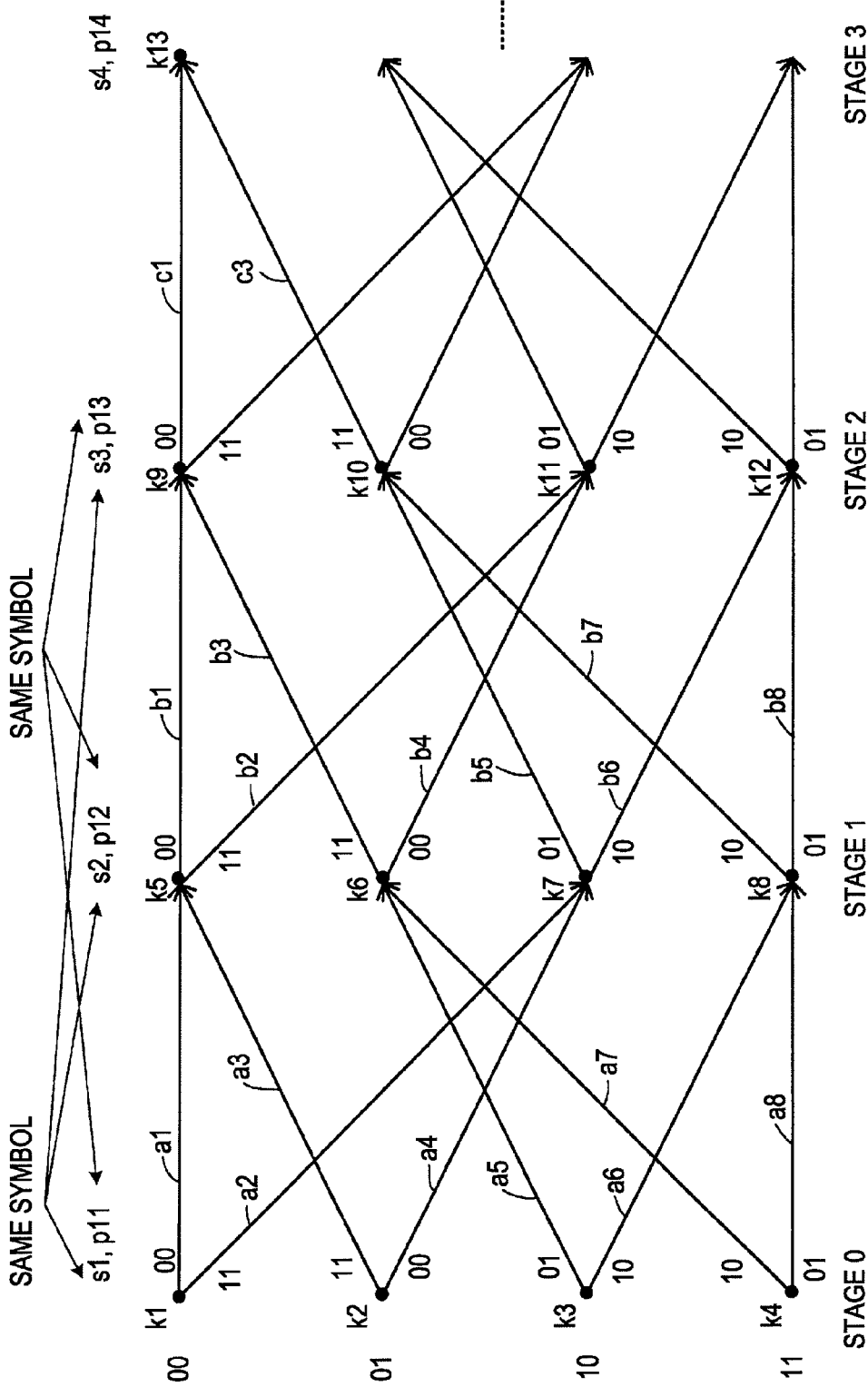
FIG. 13 is a trellis diagram illustrating the operation of the decoding unit.

Next, a symbol-based decoding operation will be described. FIG. 13 is a trellis diagram illustrating the operation of the decoding unit 63-1 when a symbol-based decoding operation is performed. The basic decoding operation is the same as described above. However, in the symbol-based decoding operation, in order to calculate the likelihood of one lattice point, it is necessary to calculate the likelihood of a plurality of stages associated with one symbol.

In the symbol-based decoding operation, systematic bits s1, s2, and s3 are, for example, symbols based on the same I component, and parity bits p11, p12, and p13 are, for example, symbols based on the same Q component.

Therefore, during the determination of the likelihood of the systematic bit, as in the above-mentioned bit-based decoding, when the likelihood calculated by one stage transition is determined, the correlation between the bits is lost. Therefore, it is preferable to determine the likelihood using a plurality of stage transitions, without dividing the stages (in this embodiment, the likelihood calculated by three stage transitions is determined).

For example, in FIG. 13, in order to calculate the likelihood of the position of a lattice point k13 in a stage 3, it is preferable to use the likelihood calculated by the transition of the stage from the stage 0 to the stage 1 and the likelihood calculated by the transition of the stage from the stage 1 to the stage 2 in addition to the likelihood calculate by the transition of the stage from the stage 2 to the stage 3 (only the likelihood may be used in the bit-based decoding operation)

Specifically, at the lattice point k13, the likelihood of the systematic bit s4 being 0 or 1 is considered. At the lattice point k13, the likelihood $P_{S4}$ of the systematic bit s4 being 0 is 0 ($P_{S4=0}$=M1+M2+M3+M4).

Here, M1 is the product of the likelihood of the bit set being transferred from the lattice point k1 to the lattice point k5 (arrow a1), the likelihood of the bit set being transferred from the lattice point k5 to the lattice point k9 (arrow 131), and the likelihood of the bit set being transferred from the lattice point k9 to the lattice point k13 (arrow c1).

M2 is the product of the likelihood of the bit set being transferred from the lattice point k2 to the lattice point k5 (arrow a3), the likelihood of the bit set being transferred from the lattice point k5 to the lattice point k9 (arrow 131), and the likelihood of the bit set being transferred from the lattice point k9 to the lattice point k13 (arrow c1).

M3 is the product of the likelihood of the bit set being transferred from the lattice point k3 to the lattice point k6 (arrow a5), the likelihood of the bit set being transferred from the lattice point k6 to the lattice point k9 (arrow b3), and the likelihood of the bit set being transferred from the lattice point k9 to the lattice point k13 (arrow c1).

M4 is the product of the likelihood of the bit set being transferred from the lattice point k4 to the lattice point k6 (arrow a7), the likelihood of the bit set being transferred from the lattice point k6 to the lattice point k9 (arrow b3), and the likelihood of the bit set being transferred from the lattice point k9 to the lattice point k13 (arrow c1).

At the lattice point k13, the likelihood $P_{S4}$ of the systematic bit s4 being 1 is 1 ($P_{S4=1}$=M5+M6+M7+M8). M5 is the product of the likelihood of the bit set being transferred from the lattice point k1 to the lattice point k7 (arrow a2), the likelihood of the bit set being transferred from the lattice point k7 to a lattice point k10 (arrow b5), and the likelihood of the bit set being transferred from the lattice point k10 to the lattice point k13 (arrow c3).

M6 is the product of the likelihood of the bit set being transferred from the lattice point k2 to the lattice point k7 (arrow a4), the likelihood of the bit set being transferred from the lattice point k7 to the lattice point k10 (arrow b5), and the likelihood of the bit set being transferred from the lattice point k10 to the lattice point k13 (arrow c3).

M7 is the product of the likelihood of the bit set being transferred from the lattice point k3 to the lattice point k8 (arrow a6), the likelihood of the bit set being transferred from the lattice point k8 to a lattice point k10 (arrow b7), and the likelihood of the bit set being transferred from the lattice point k10 to the lattice point k13 (arrow c3).

M8 is the product of the likelihood of the bit set being transferred from the lattice point k4 to the lattice point k8 (arrow a8), the likelihood of the bit set being transferred from the lattice point k8 to a lattice point k10 (arrow b7), and the likelihood of the bit set being transferred from the lattice point k10 to the lattice point k13 (arrow c3).

Therefore, the likelihood $P_{S4}$ of the systematic bit s4 being 0 ($P_{S4=0}$) is compared with the likelihood $P_{S4}$ of the systematic bit s4 being 1 ($P_{S4=1}$), and the likelihood having a larger value is selected. As described above, in the symbol-based decoding, eight combinations are needed to calculate the likelihood of one lattice point.

Figure 14:
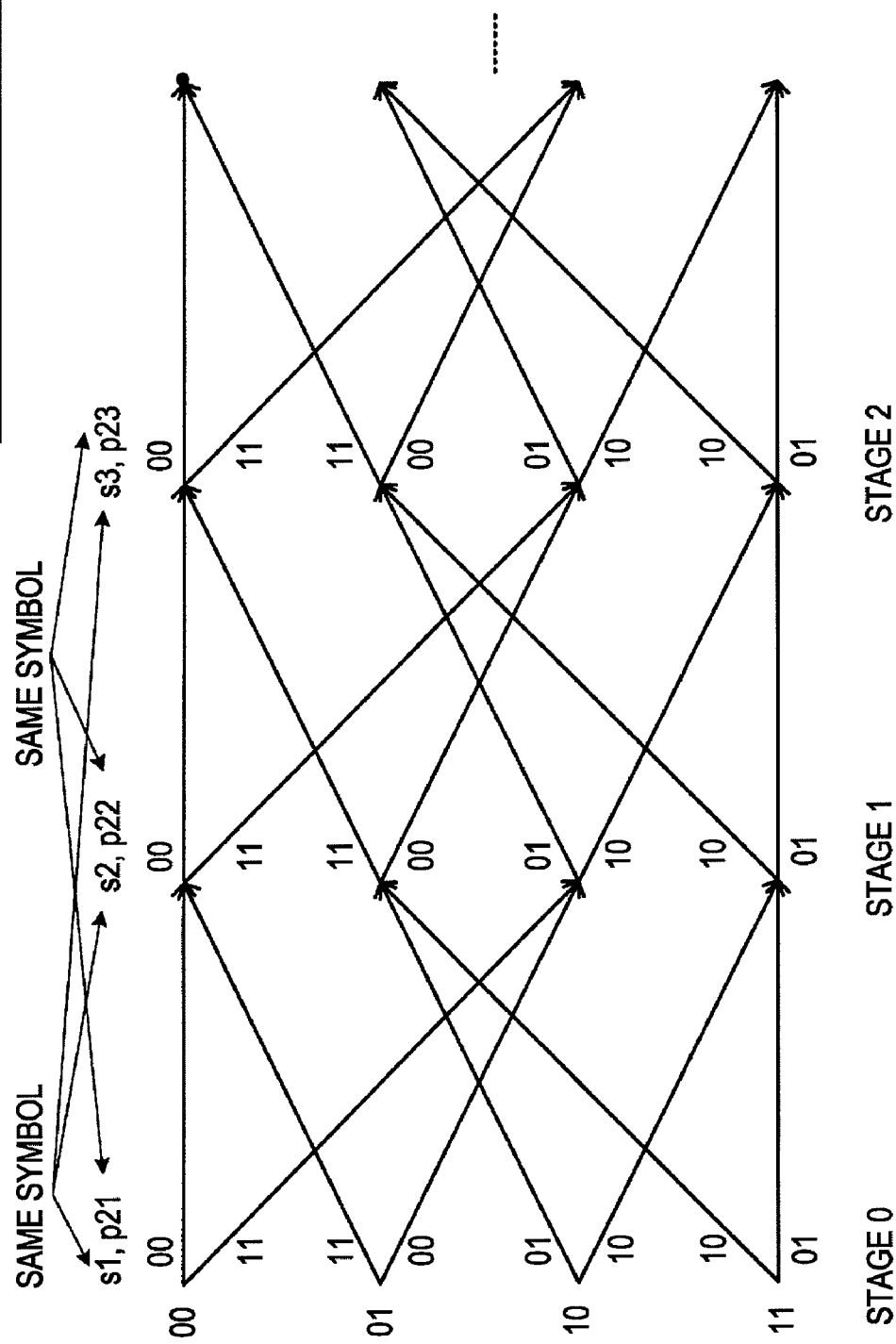
FIG. 14 is a trellis diagram illustrating the operation of the decoding unit.

FIG. 14 is a trellis diagram illustrating the operation of the decoding unit 63-2. The decoding unit 63-2 performs the same decoding operation as that illustrated in FIG. 13. Two decoding units 63-1 and 63-2 perform symbol-based decoding.

Figure 15:
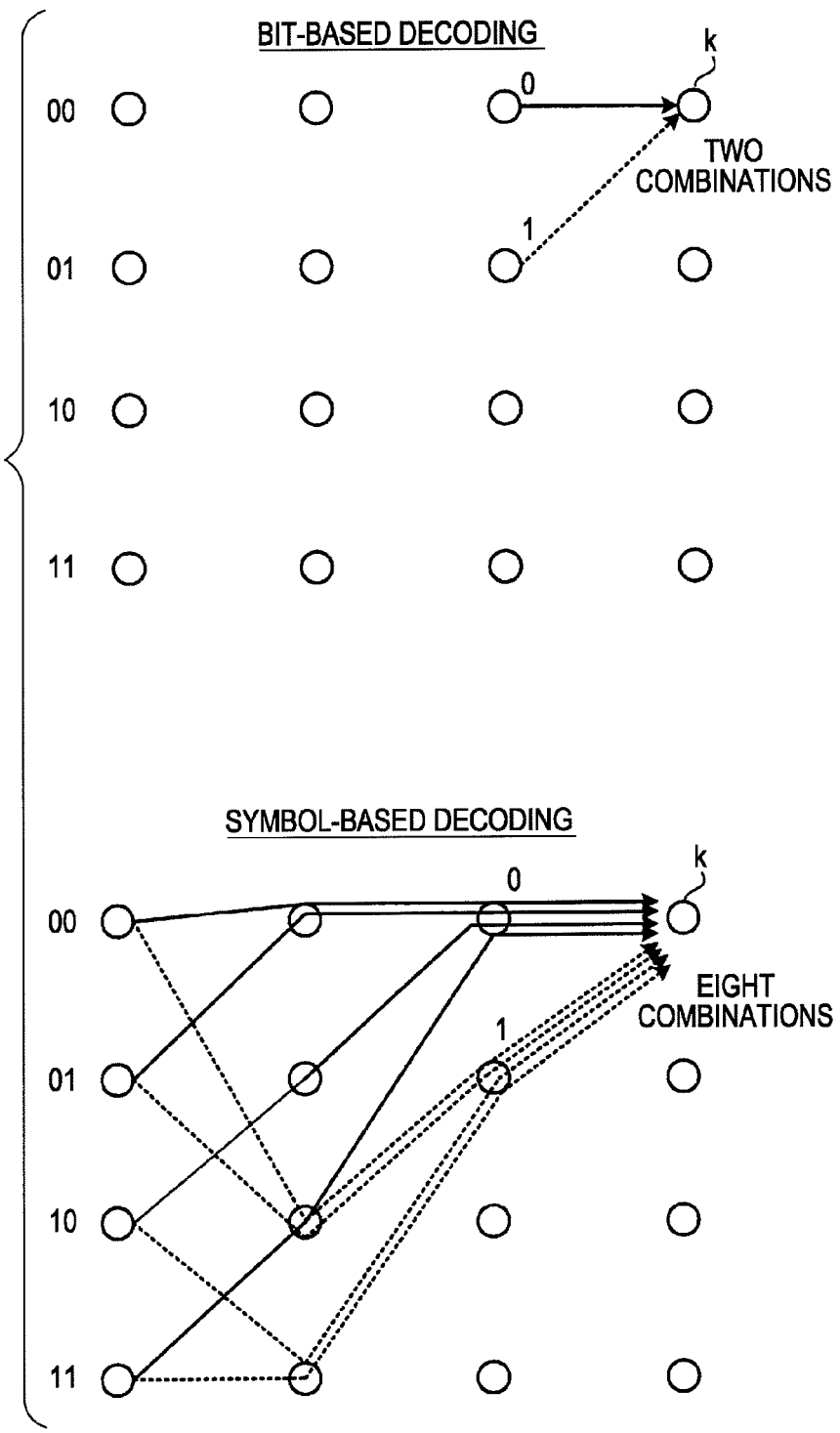
FIG. 15 is a diagram illustrating the comparison of the number of combinations during the determination of likelihood.

FIG. 15 is a diagram illustrating the comparison of the number of combinations when the likelihood is determined. FIG. 15 briefly illustrates the trellis diagram such that a difference in combination is easily understood. In the bit-based decoding, when the likelihood of the lattice point k is calculated, the transition of one stage may be considered. Therefore, two combinations are sufficient. However, in the symbol-based decoding, when the likelihood of the lattice point k is calculated, the transition of three stages is considered in 64QAM. Therefore, eight combinations of 2³ are needed.

As such, in the symbol-based decoding, patterns that are four times more than those in the bit-based decoding are stored. Therefore, storage capacity is increased. When there are a large number of modulation multiple values, the number of patterns to be stored is exponentially increased (for example, 16 combinations of $2^4$ in 256QAM).

As described above, in the conventional symbol-based encoding/decoding process, the random property deteriorates, which results in deterioration of characteristics, and the storage capacity is increased. Therefore, the communication system according to this embodiment of the invention solves the above-mentioned problems.

Figure 16:
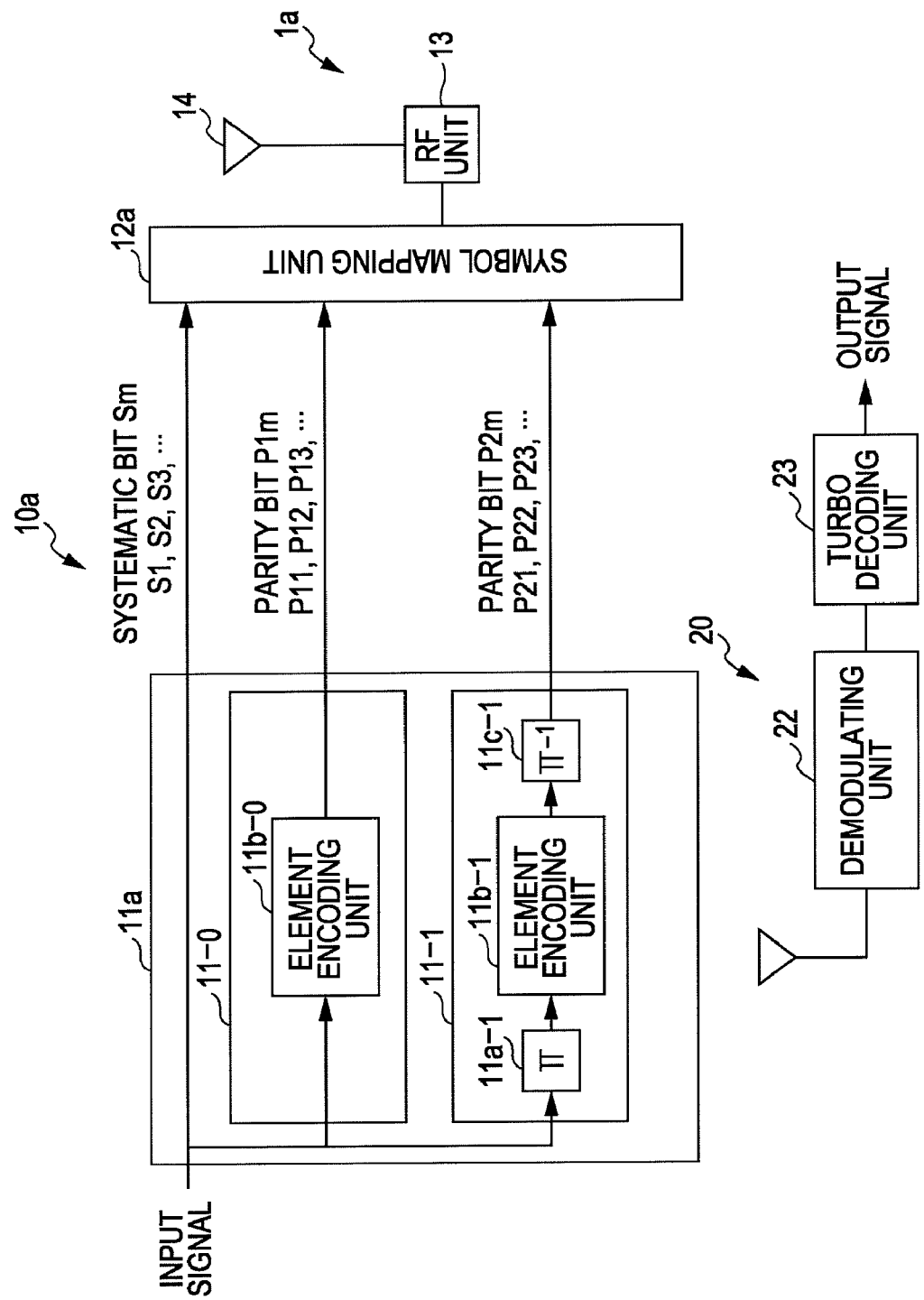
FIG. 16 is a diagram illustrating the structure of a communication system.

Next, the communication system 1 capable of solving the problems will be described in detail. Hereinafter, 64QAM communication will be described as an example. FIG. 16 is a diagram illustrating the structure of the communication system.

A communication system 1a includes a transmitting apparatus 10a and a receiving apparatus 20. The transmitting apparatus 10a includes a turbo encoding unit 11a, a symbol mapping unit 12a, an RF unit 13, and an antenna 14. The turbo encoding unit 11a includes an encoding unit 11-0 and an encoding unit 11-1. The structure of the receiving apparatus 20 is the same as that illustrated in FIG. 2.

The encoding unit 11-0 includes an element encoding unit 11b-0, and the encoding unit 11-1 includes an interleaver 11a-1, an element encoding unit 11b-1, and a deinterleaver 11c-1.

The element encoding unit 11b-0 of the encoding unit 11-0 performs convolution encoding on an input signal and outputs a parity bit P1 (first parity bit). The interleaver 11a-1 of the encoding unit 11-1 interleaves the input signal to rearrange the input signal on a bit basis. The element encoding unit 11b-1 performs convolution encoding on the interleaved input signal, and the deinterleaver 11c-1 deinterleaves the convolutionally encoded signal on a bit basis and outputs a parity bit P2 (second parity bit).

The symbol mapping unit 12a maps a systematic bit S and the parity bits P1 and P2 to I and Q components of 64QAM. The RF unit 13 up-converts the output from the symbol mapping unit 12a into an RF frequency and outputs the RF frequency through the antenna 14.

Figure 17:
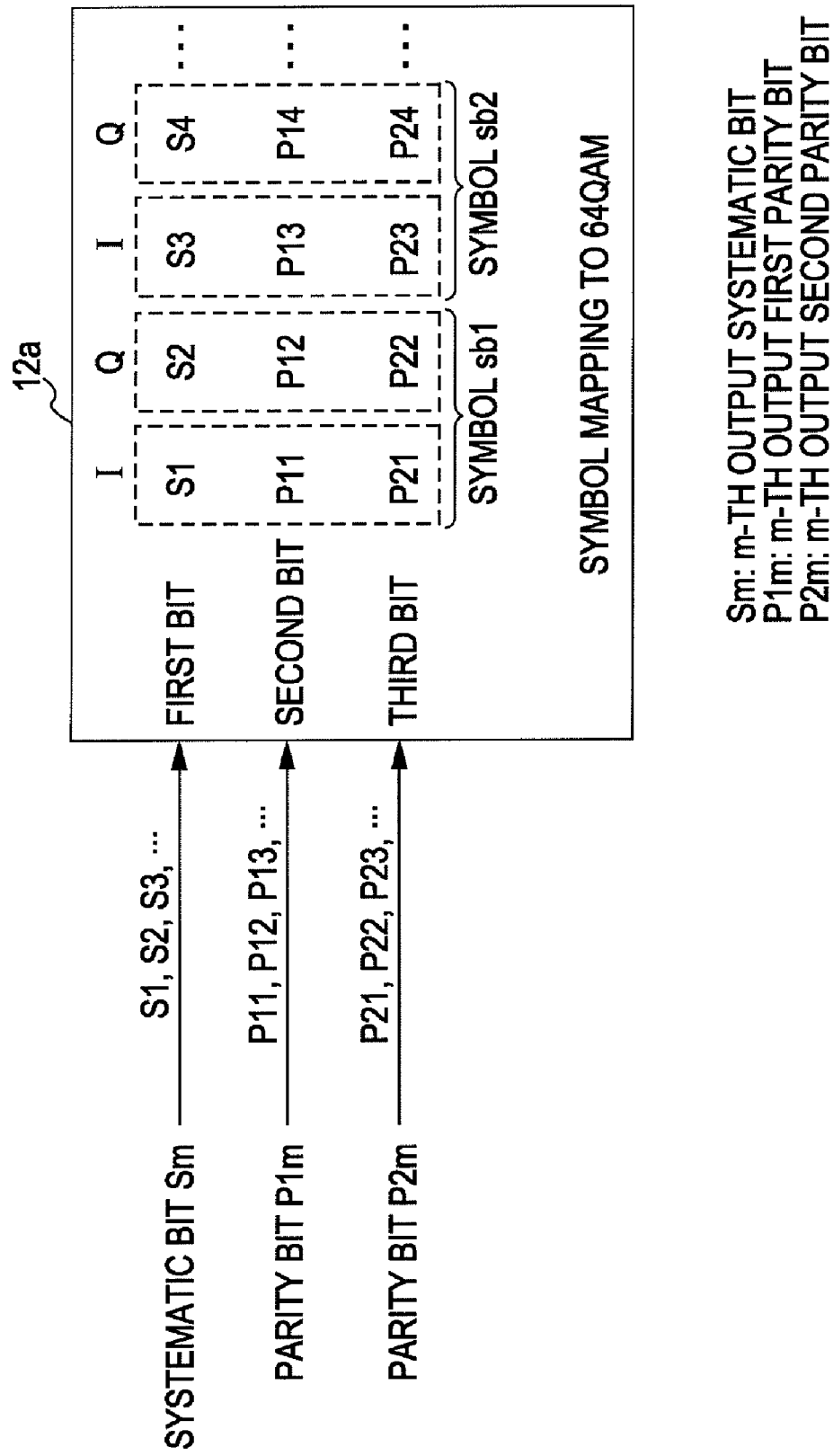
FIG. 17 is a diagram illustrating a symbol mapping operation.

FIG. 17 is a diagram illustrating a symbol mapping operation. The turbo encoding unit 11a outputs a systematic bit Sm, a parity bit P1m, and a parity bit P2m (m indicates an output order). Since one symbol is 6 bits in 64QAM, the symbol mapping unit 12a maps 3 bits to the I component and maps 3 bits to the Q component. In addition, it is assumed that, in each of the I component and the Q component, the first bit is MSB, a second bit is an intermediate bit, and a third bit is LSB.

In the symbol mapping operation, for example, for a first symbol (which is referred to as a symbol sb1), (S1, P11, P21) are mapped to the MSB, the intermediate bit, and the LSB of an I component of the symbol sb1, respectively, and (S2, P12, P22) are mapped to the MSB, the intermediate bit, and the LSB of a Q component of the symbol sb1, respectively.

For the next symbol (which is referred to as a symbol sb2), (S3, P13, P23) are mapped to the MSB, the intermediate bit, and the LSB of an I component of the symbol sb2, respectively, and (S4, P14, P24) are mapped to the MSB, the intermediate bit, and the LSB of a Q component of the symbol sb2, respectively. Similarly, mapping is performed on the subsequent symbols.

As such, the symbol mapping unit 12a maps the systematic bit S and a parity bit corresponding to the systematic bit S (a parity bit, which is a redundant bit generated for error correction and corresponding to the systematic bit) to one symbol (the mapping of the bits to one symbol means that the bits are mapped to each of the I and Q components of one symbol).

For example, as described above, since the parity bits P11 and P21 correspond to the systematic bit S1, the 3 bits are mapped to the I component. Since the parity bits P12 and P22 correspond to the next output systematic bit S2, the 3 bits are mapped to the Q component.

Figure 18:
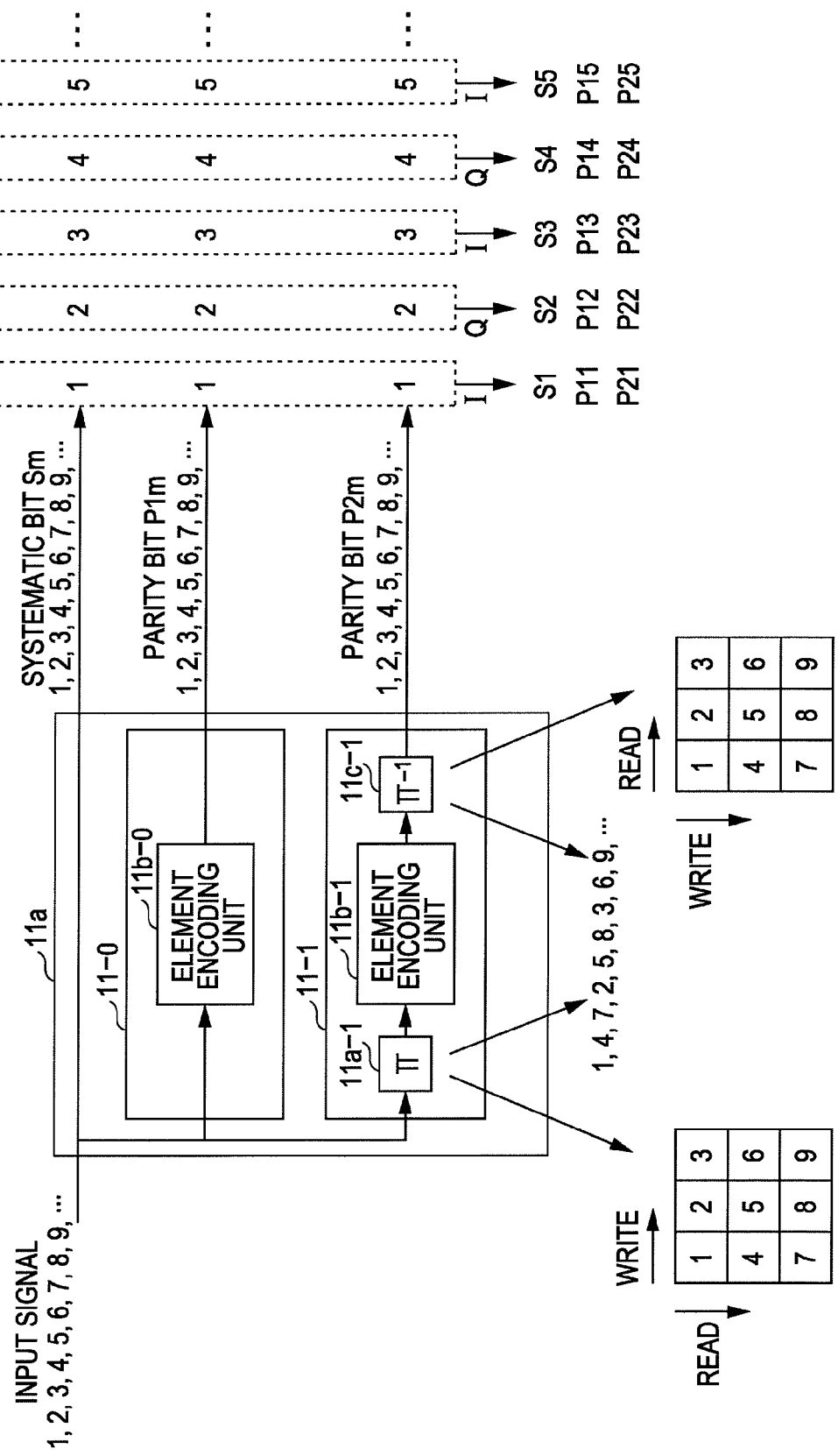
FIG. 18 is a diagram illustrating the output state of a turbo encoding unit.

FIG. 18 is a diagram illustrating the output state of the turbo encoding unit 11a. It is assumed that input signals 1, 2, 3, . . . are given to the turbo encoding unit 11a. Then, a systematic bit Sm=(1, 2, 3, . . . ) is output. The element encoding unit 11b-0 performs convolution encoding on the input signals 1, 2, 3, . . . , and outputs a parity bit P1m=(1, 2, 3, . . . ).

The interleaver 11a-1 interleaves the input signal 1, 2, 3, . . . on a bit basis and outputs signals 1, 4, 7, . . . . The element encoding unit 11b-1 performs convolution encoding on the signals 1, 4, 7, . . . , and outputs signals 1, 4, 7, . . . . The deinterleaver 11c-1 deinterleaves the signals 1, 4, 7, . . . , and outputs a parity bit P2m=(1, 2, 3, . . . ).

Then, the symbol mapping unit 12a maps the systematic bit S1=1, the parity bit P11=1, and the parity bit P21=1 to the I component, and maps the systematic bit S2=2, the parity bit P12=2, and the parity bit P22=2 to the Q component. Mapping is performed on the subsequent bits by the same method as described above.

In the encoding unit 11-1, the interleaver 11a-1 performs bit-based interleaving, the element encoding unit 11b-1 performs convolution encoding on the interleaved data, and the deinterleaver 11c-1 deinterleaves the convolutionally encoded data and returns the arrangement sequence of data to the original sequence.

The deinterleaver 11c-1 causes the systematic bit Sm=(1, 2, 3, . . . ), the parity bit P1m=(1, 2, 3, . . . ), and the parity bit P2m=(1, 2, 3, . . . ) to be output from the turbo encoding unit 11a. Therefore, the symbol mapping unit 12a may map every 3 bits output from the turbo encoding unit 11a to the I component or the Q component of the symbol.

In this way, the transmitting apparatus 10a illustrated in FIG. 16 generates a code word having an encoding rate of ⅓ and transmits it. When the transmitting apparatus 10a adds a redundant word b to an information word a and transmits the information word, the encoding rate is a/(a+b). Since a indicates one systematic bit and b indicates one parity bit P1 and one parity bit P2, the encoding rate is ⅓.

Figure 19:
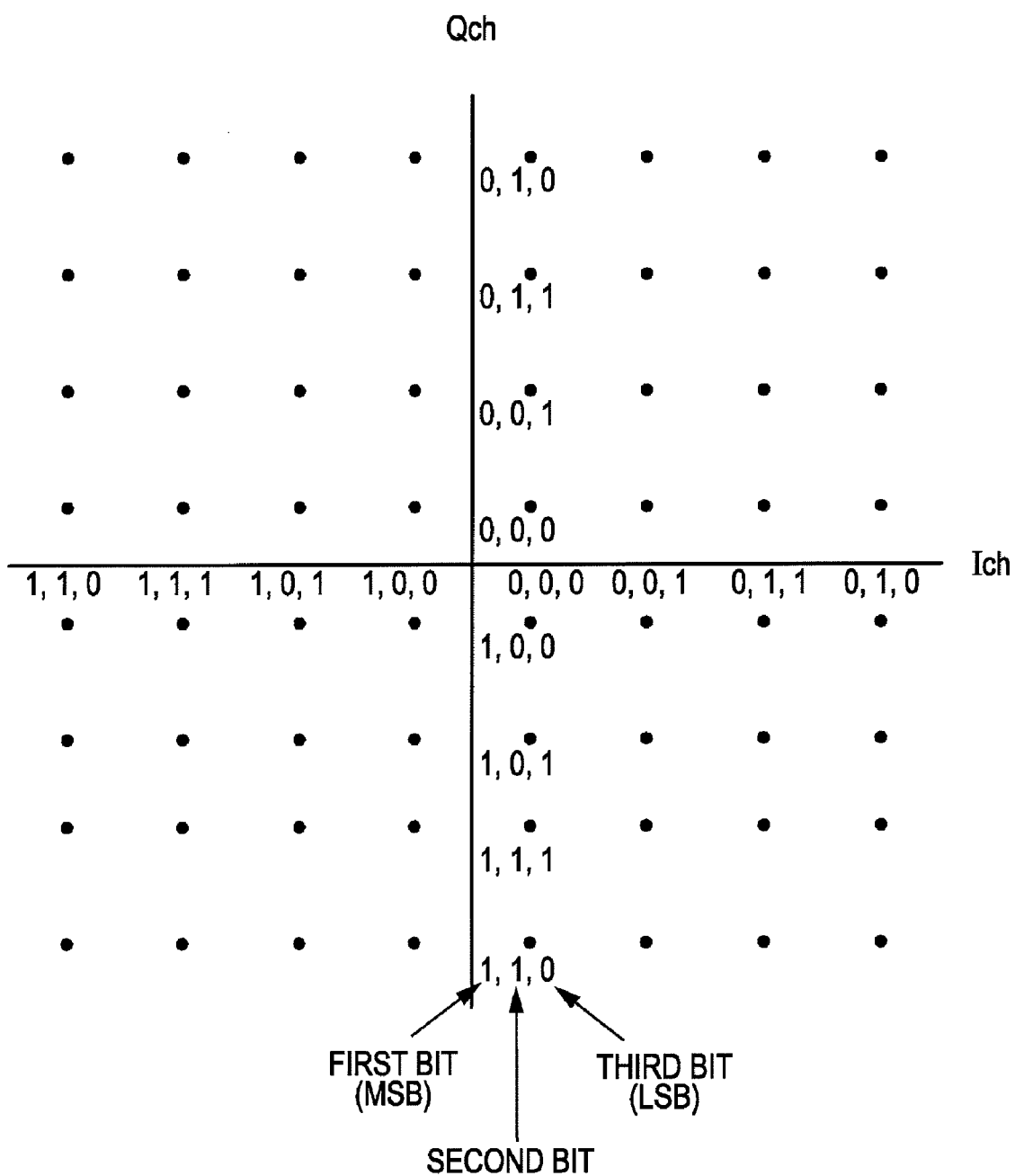
FIG. 19 is a diagram illustrating the constellation of 64QAM.

FIG. 19 is a diagram illustrating the constellation of 64QAM. In FIG. 19, the horizontal axis indicates Ich, and the vertical axis indicates Qch. FIG. 19 illustrates the relationship between the mapping of first to third bits and the constellation of 64QAM.

Figure 20:
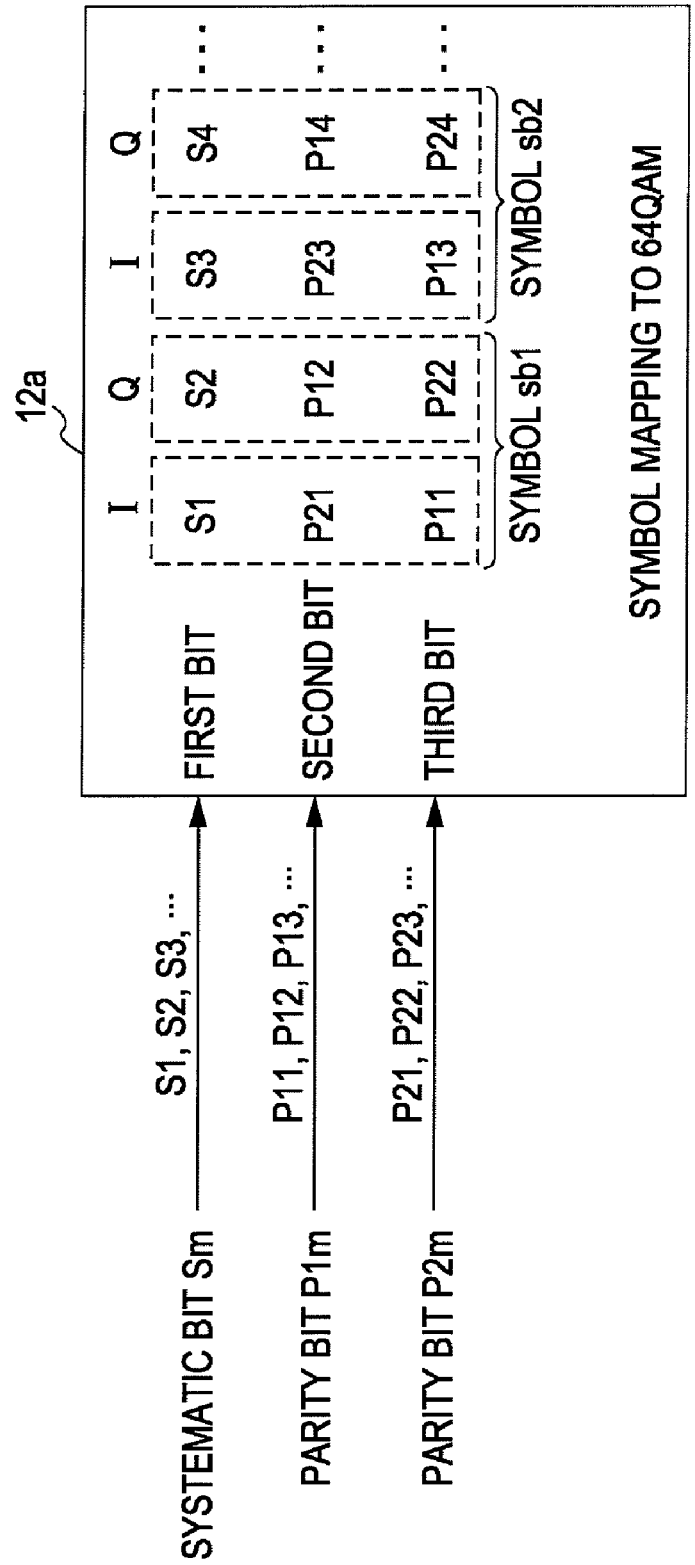
FIG. 20 is a diagram illustrating a symbol mapping pattern.

Next, a mapping pattern other than symbol mapping will be described. FIG. 20 is a diagram illustrating a symbol mapping pattern. Since the outputs from the encoding units 11-0 and 11-1 are similarly processed by a decoding side, it is preferable that symbol mapping be performed on the parity bits P1m and P2m such that the same signal quality is obtained.

Therefore, as illustrated in FIG. 20, the parity bit P1m and the parity bit P2m are mapped to the second bit (intermediate bit) and the third bit (LSB) of 64QAM (with a probability of about 50%).

Next, turbo decoding will be described. The transmitter side maps a set of the systematic bit S, the parity bit P1, which is a redundant bit corresponding to the systematic bit S, and the parity bit P2, which is a redundant bit corresponding to the systematic bit S, and transmits it. Therefore, the receiver side wants to decode the set of the systematic bit S and the parity bits P1 and P2 without breaking the set.

However, when the systematic bit S and the parity bits P1 and P2 are decoded without breaking the set thereof, storage capacity is increased. Therefore, the turbo decoding unit 23 decodes a set of the systematic bit S and the parity bit P1 and a set of the systematic bit S and the parity bit P2.

That is, turbo decoding is performed on a set of the systematic bit Sm and the parity bit Pkm (1≦k≦n+1 (k is a natural number and n is the number of second encoding units)). For example, when n=1, k is 1 and 2. Therefore, a set of the systematic bit Sm and the parity bit P1m and a set of the systematic bit Sm and the parity bit P2m are decoded.

Figure 21:
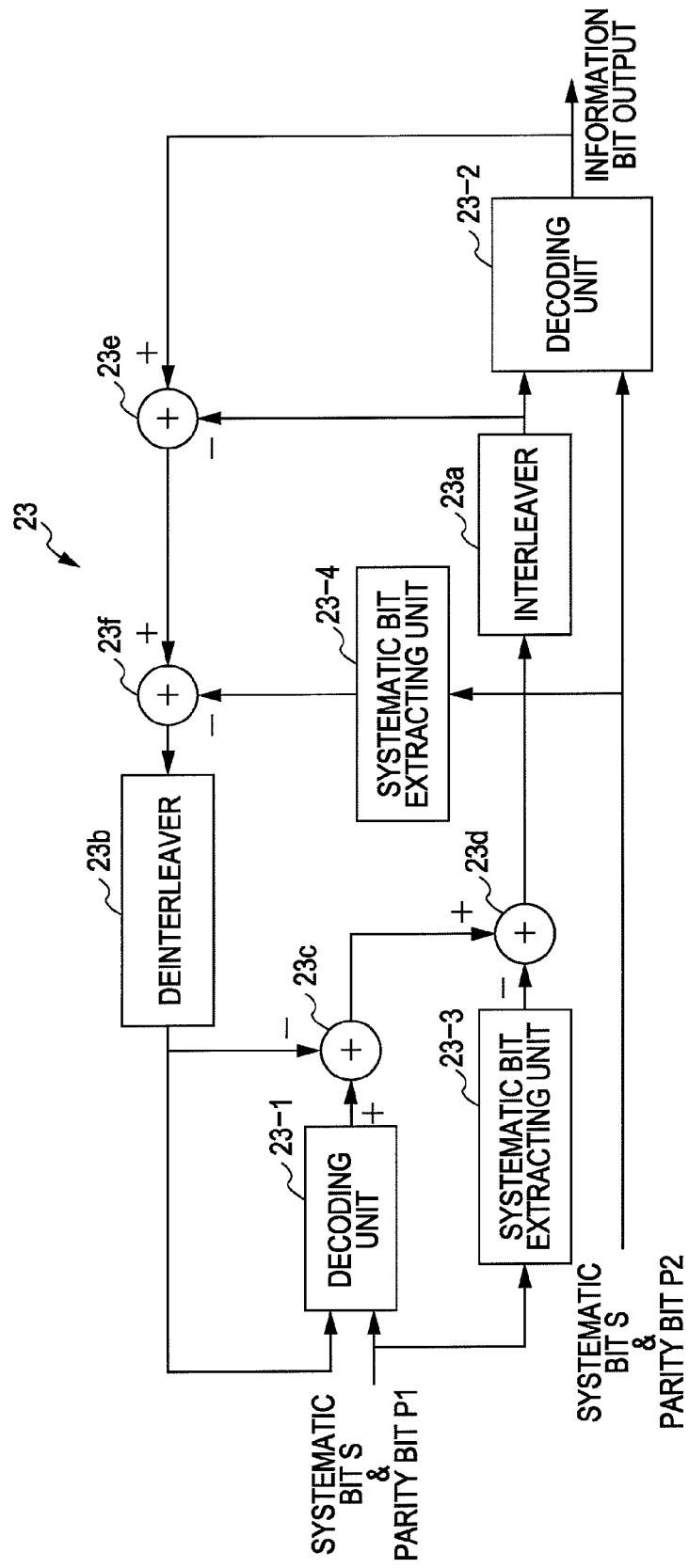
FIG. 21 is a diagram illustrating the structure of a turbo decoding unit.

FIG. 21 is a diagram illustrating the structure of the turbo decoding unit 23. The turbo decoding unit 23 includes decoding units 23-1 and 23-2, systematic bit extracting units 23-3 and 23-4, an interleaver 23a, a deinterleaver 23b, and arithmetic units 23c to 23f.

The output of the deinterleaver 23b and received code data, which is a set of the systematic bit S and the parity bit P1, are input to the decoding unit 23-1, and the decoding unit 23-1 outputs as a determination value the likelihood of the systematic bit S that is estimated to have high likelihood. The arithmetic unit 23c subtracts the output of the deinterleaver 23b from the determination value.

The systematic bit extracting unit 23-3 extracts the systematic bit S from a set of the input systematic bit S and the parity bit P1 and outputs the extracted systematic bit S, and the arithmetic unit 23d subtracts the output of the systematic bit extracting unit 23-3 from the output of the arithmetic unit 23c.

The interleaver 23a interleaves the output of the arithmetic unit 23d on a bit basis. The output of the interleaver 23a and received code data, which is a set of the systematic bit S and the parity bit P2, are input to the decoding unit 23-2, and the decoding unit 23-2 performs decoding and outputs as a determination value the likelihood of the systematic bit S that is estimated to have high likelihood.

The arithmetic unit 23e subtracts the output of the interleaver 23a from the output of the decoding unit 23-2. The systematic bit extracting unit 23-4 extracts the systematic bit S from a set of the systematic bit S and the parity bit P2 and outputs the extracted systematic bit S, and the arithmetic unit 23f subtracts the output of the systematic bit extracting unit 23-4 from the output of the arithmetic unit 23e. The deinterleaver 23b deinterleaves the output of the arithmetic unit 23f on a bit basis, and outputs the deinterleaved result to the decoding unit 23-1.

As such, the decoding unit 23-1 performs decoding using a set of the systematic bit S and the parity bit P1, and the decoding unit 23-2 performs decoding using a set of the systematic bit S and the parity bit P2.

The output of each constituent element is a value related to the probability of the output being close to 0 or 1, that is, likelihood. Exactly, a log likelihood ratio is used. Simply, the log likelihood ratio is represented by the logarithm of the ratio of the likelihood P(x=1|y) of y being 1 and the likelihood P(x=0|y) of y being 0 when a transmission bit x is 1 or 0 and a reception bit is y, and the log likelihood ratio L(x|y) is represented by the equation given below:

$$L(x|y)=\text{Log}(P(x=1|y)/P(x=0y)) \quad (2)$$

For example, as the log likelihood ratio L(x|y) is close to a probability of 1, a larger positive value is obtained.

Next, the operation of the turbo decoding unit 23 will be described with reference to a trellis diagram. FIG. 22 is a trellis diagram illustrating the operation of the turbo decoding unit 23. FIG. 22 illustrates a trellis diagram when the signal in which the systematic bit Sm and the parity bits P1m and P2m are mapped to one symbol is decoded.

The decoding unit 23-1 calculates the likelihood of the systematic bit when (the systematic bit Sm, the parity bit P1m) is input. The decoding unit 23-2 calculates the likelihood of the systematic bit when (the systematic bit S, the parity bit P2m) is input. In this way, one symbol is divided into two elements, and the likelihood is calculated. Therefore, it is possible to prevent the loss of information between the bits and suppress deterioration. In addition, unlike the symbol-based decoding operation according to the related art, it is possible to perform bit-based decoding and thus reduce the storage capacity.

Next, a trellis operation will be described. FIG. 22 illustrates the outline of the trellis operation using only the forward likelihood (in the trellis diagram, the likelihood when an arrow is directed from the left side to the right side). However, actually, the trellis operation also uses the backward likelihood (in the trellis diagram, the likelihood when an arrow is directed from the right side to the left side). Therefore, here, a method of calculating the likelihoods of the systematic bit being 0 and 1 using the forward likelihood and the backward likelihood will be described.

Figure 23:
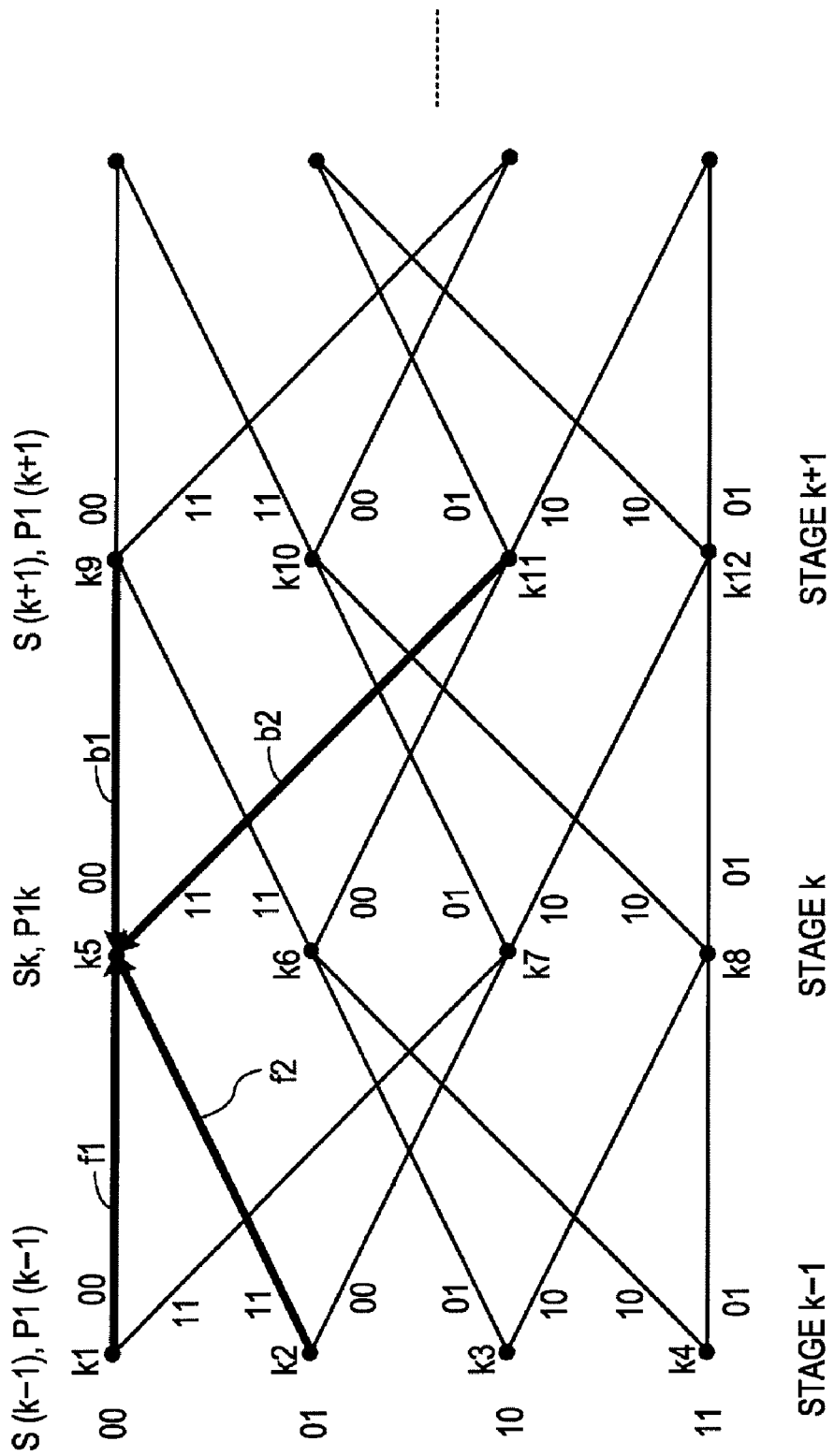
FIG. 23 is a diagram illustrating a trellis operation of the turbo decoding unit.

FIG. 23 is a diagram illustrating the trellis operation of the turbo decoding unit 23. It is assumed that the forward likelihoods in each state of a stage k are $F_{k,00}$, $F_{k,01}$, $F_{k,10}$, and $F_{k,11}$ and the backward likelihoods in each state of the stage k are $B_{k,00}$, $B_{k,01}$, $B_{k,10}$, and $B_{k,11}$. In addition, it is assumed that the probability of a systematic bit Sk of the stage k being 0 is $R_{Sk}$ and the probability of a parity bit P1k of the stage k being 0 is $R_{P1k}$.

Here, the calculation of the forward likelihood $F_{k,00}$ in the state 00 of the stage k (the forward likelihood of the lattice point k5) is considered. The forward likelihood $F_{k,00}$ is the sum of the likelihood of an arrow f1 and the likelihood of an arrow f2.

Since the forward likelihood of the lattice point k1 is represented by $F_{k-1,00}$, the forward likelihood $F_{00}(0)$ of the systematic bit being 0 is represented by the equation given below (which corresponds to the likelihood of the arrow f1):

$$F_{k,00}(0)=F_{k-1,00} \times R_{Sk} \times R_{P1k} \quad (3)$$

Since the forward likelihood of the lattice point k2 is represented by $F_{k-1,01}$, the forward likelihood $F_{k,00}(1)$ of the systematic bit being 1 is represented by the equation given below (which corresponds to the likelihood of the arrow f2).

$$F_{k,00}(1)=F_{k-1,01} \times (1-R_{Sk}) \times (1-R_{P1k}) \quad (4)$$

Therefore, the forward likelihood $F_{k,00}$ is represented by the equation given below:

$$F_{k,00}=F_{k,00}(0)+F_{k,00} \quad (5)$$

$F_{k,00}$ is used for the forward operation of each stage.

Next, the calculation of the backward likelihood $B_{k,00}$ in the state 00 of the stage k (the backward likelihood of the lattice point k5) is considered. The backward likelihood $B_{k,00}$ is the sum of the likelihood of an arrow b1 and the likelihood of an arrow b2.

Since the backward likelihood of the lattice point k9 is represented by $B_{k+1,00}$, the backward likelihood $B_{k,00}(0)$ of the systematic bit being 0 is represented by the equation given below (which corresponds to the likelihood of the arrow 131):

$$B_{k,00}(0)=B_{k+1,00} \times R_{Sk} \times R_{P1k} \quad (6)$$

Since the backward likelihood of the lattice point k11 is represented by $B_{k+1,10}$, the backward likelihood $B_{k,00}(1)$ of the systematic bit being 1 is represented by the equation given below (which corresponds to the likelihood of the arrow b2).

$$B_{k,00}(1)=B_{k+1,10} \times (1-R_{Sk}) \times (1-R_{P1k}) \quad (7)$$

Therefore, the backward likelihood $B_{k,00}$ is represented by the equation given below:

$$B_{k,00}=B_{k,00}(0)+B_{k,00} \quad (8)$$

$B_{k,00}$ is used for the backward operation of each stage.

The forward likelihood and the backward likelihood in states other than the state 00 are calculated by the same method as described above. When the likelihood of the systematic bit Sk in the stage k being 0 is Ak(0) and the likelihood of the systematic bit Sk in the stage k being 1 is Ak(1), the likelihoods Ak(0) and Ak(1) may be calculated by the following equations.

$$Ak(0)=F_{k,00}(0) \times B_{k,00}(0)+F_{k,01}(0) \times B_{k,01}(0)+F_{k,10}(0) \times B_{k,10}(0)+F_{k,11}(0) \times B_{k,11}(0) \quad (9a)$$

$$Ak(1)=F_{k,00}(1) \times B_{k,00}(1)+F_{k,01}(1) \times B_{k,01}(1)+F_{k,10}(1) \times B_{k,10}(1)+F_{k,11}(1) \times B_{k,11}(1) \quad (9b)$$

The likelihoods in all the stages are calculated by the same method as described above, and bit-based interleaving is performed. Then, the interleaved result is input to one decoding unit 23-2.

Figure 24:
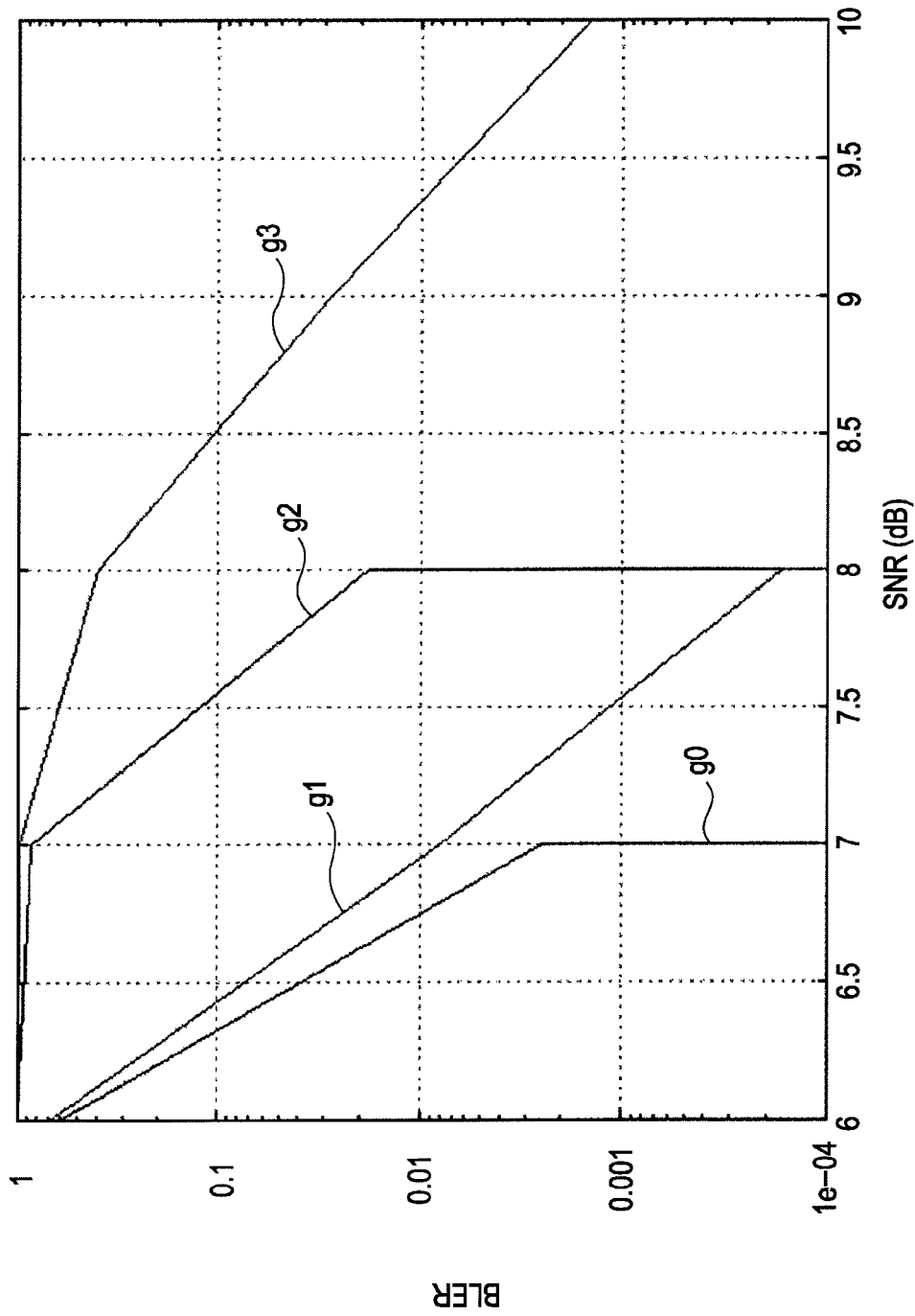
FIG. 24 is a diagram illustrating the characteristics of the communication system.

Next, the measurement results of the characteristics of the communication system 1a will be described. FIG. 24 is a diagram illustrating the characteristics of the communication system 1a. In FIG. 24, the horizontal axis indicates SNR, and the vertical axis indicates BLER. A graph g0 indicates the turbo encoding/decoding characteristics of the communication system 1a.

In the communication system 1a, the transmitter side performs bit-based interleaving, and maps the parity bits P1m and P2m related to the systematic bit Sm to the same symbol. The receiver side decodes one symbol based on a set of the systematic bit Sm and the parity bit P1m and a set of the systematic bit Sm and the parity bit P2m. As can be seen from the graph g0 indicating the characteristics of the communication system 1a, the characteristics of the communication system are improved, as compared to the graphs g1 to g3 illustrated in FIG. 9.

Next, a communication system having a rate matching function, which is a modification of the communication system 1, will be described. In wireless communication, such as W-CDMA (wideband code division multiple access) or WiMAX (worldwide interoperability for microwave access), rate matching is performed in order to match various transmission rates with appropriate physical formats.

Therefore, when there is a rate matching function, it is possible to effectively use information between bits to perform decoding by mapping a systematic bit and a corresponding parity bit to the same symbol. In order to reduce the transmission rate to a predetermined value for matching, the parity bits P1 and P2, which are redundant bits, are appropriately removed by the rate matching.

FIGS. 25 to 28 are diagrams illustrating symbol mapping after rate matching. In a transmitting apparatus 10a-1, a rate matching unit 15 that changes the transmission rate is inserted between a turbo encoding unit 11a and a symbol mapping unit 12a-1. The other structures are the same as those in the communication system 1 (the RF unit 13 and the antenna 14 are not illustrated).

Figure 25:
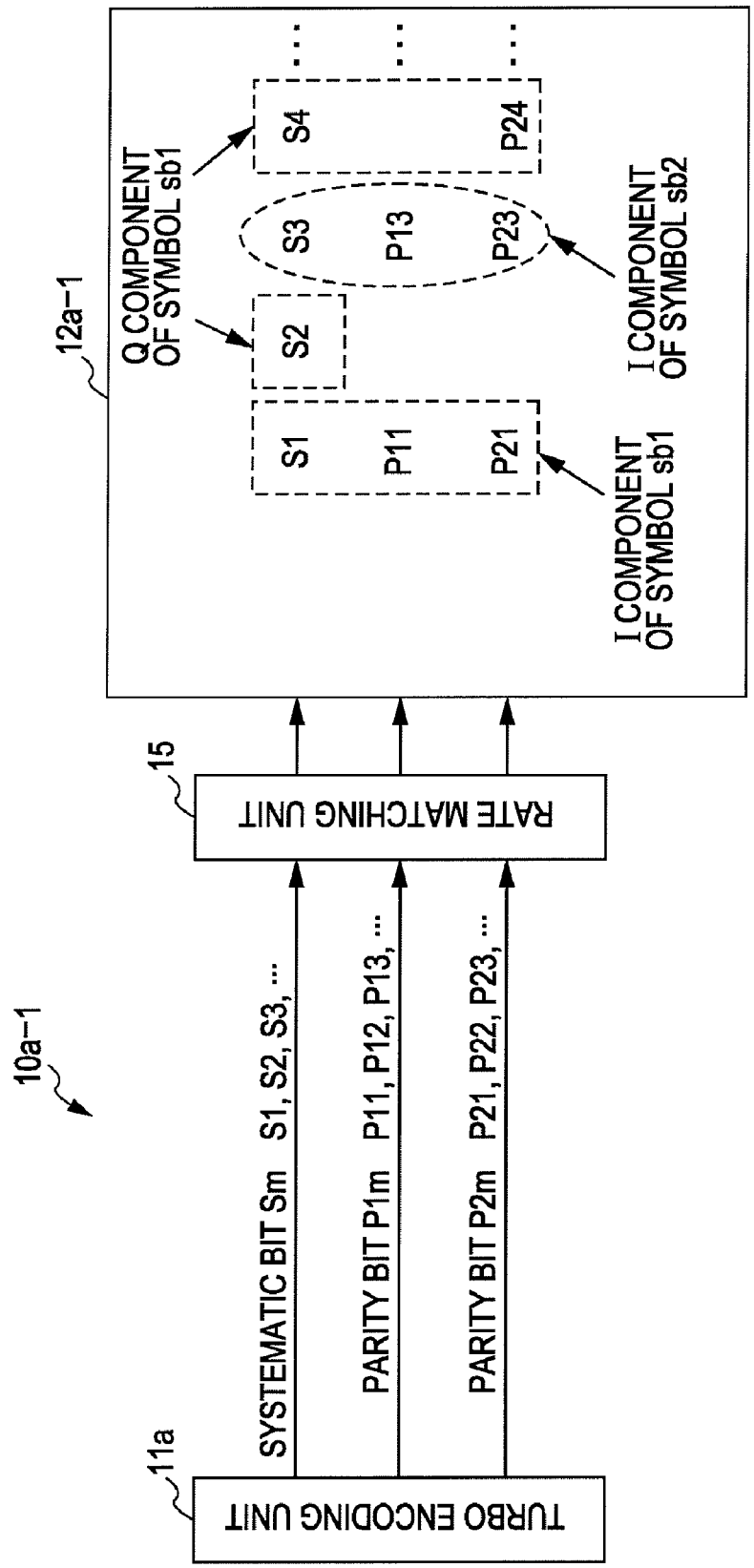
FIG. 25 is a diagram illustrating symbol mapping after rate matching.

The transmitting apparatus 10a-1 illustrated in FIG. 25 performs 64QAM mapping. Therefore, there is little puncture (removal bit) and there is a set of the systematic bit Sm, the parity bit P1m, and the parity bit P2m.

The rate matching unit 15 removes the parity bits P12 and P14 and the parity bit P22. In this case, the symbol mapping unit 12a-1 maps (51, P11, P21) to the I component of the symbol sb1, maps (S2, S4, P24) to the Q component of the symbol sb1, and maps (S3, P13, P23) to the I component of the symbol sb2.

Figure 26:
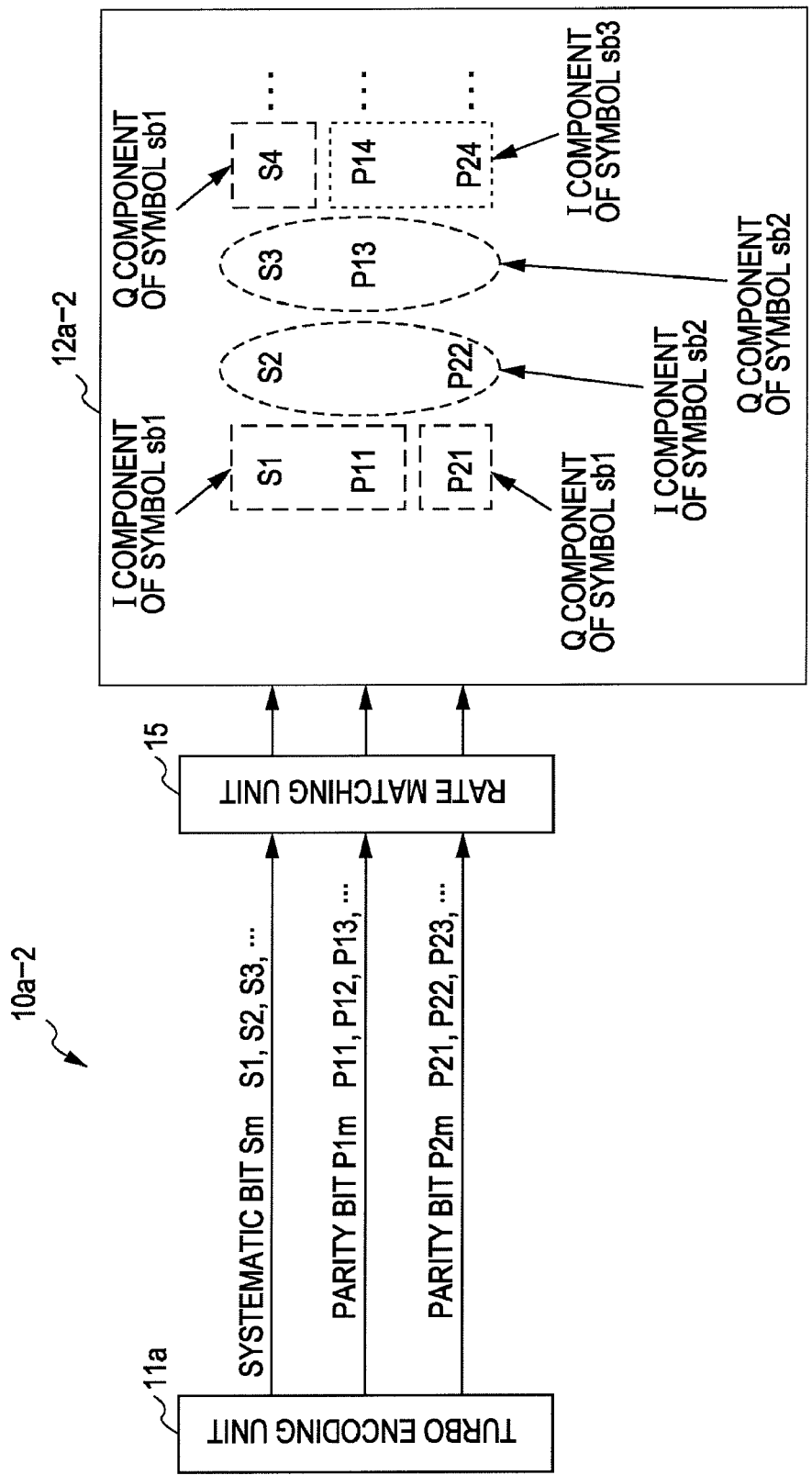
FIG. 26 is a diagram illustrating symbol mapping after rate matching.

A transmitting apparatus 10a-2 illustrated in FIG. 26 performs 16QAM mapping, and there is little puncture (in the 16QAM mapping, 2 bits are mapped to each of the I and Q components). The rate matching unit 15 removes the parity bit P12 and the parity bit P23.

In this case, a symbol mapping unit 12a-2 maps (S1, P11) to the I component of the symbol sb1, maps (S4, P21) to the Q component of the symbol sb1, maps (S2, P22) to the I component of the symbol sb2, maps (S3, P13) to the Q component of the symbol sb2, and maps (P14, P24) to the I component of the symbol sb3.

Figure 27:
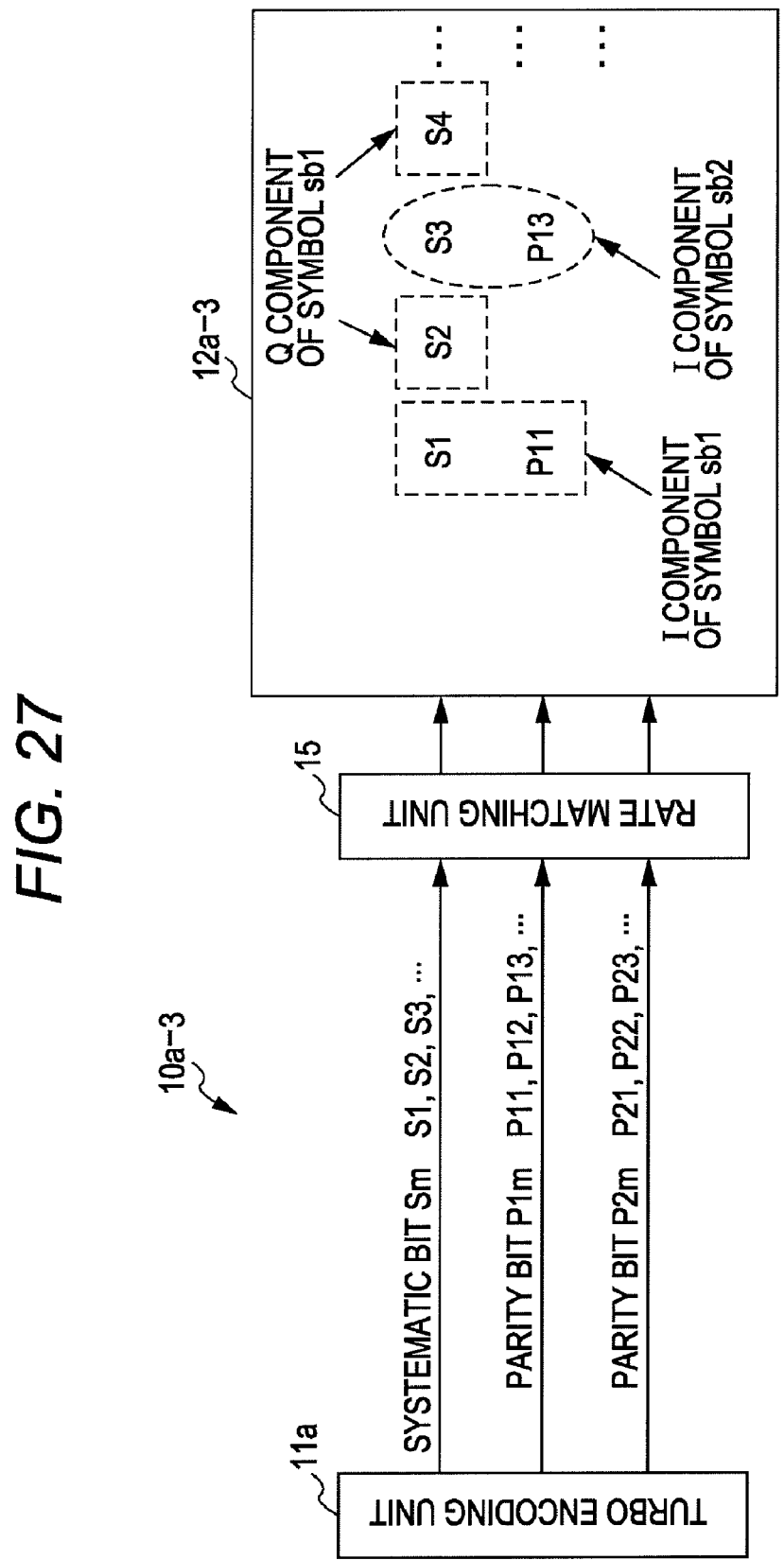
FIG. 27 is a diagram illustrating symbol mapping after rate matching.

A transmitting apparatus 10a-3 illustrated in FIG. 27 performs 16QAM mapping, and there is a large puncture. The rate matching unit 15 removes the parity bits P12 and P14 and the parity bits P21, P22, P23, and P24.

In this case, a symbol mapping unit 12a-3 maps (S1, P11) to the I component of the symbol sb1, maps (S2, S4) to the Q component of the symbol sb1, and maps (S3, P13) to the I component of the symbol sb2.

Figure 28:
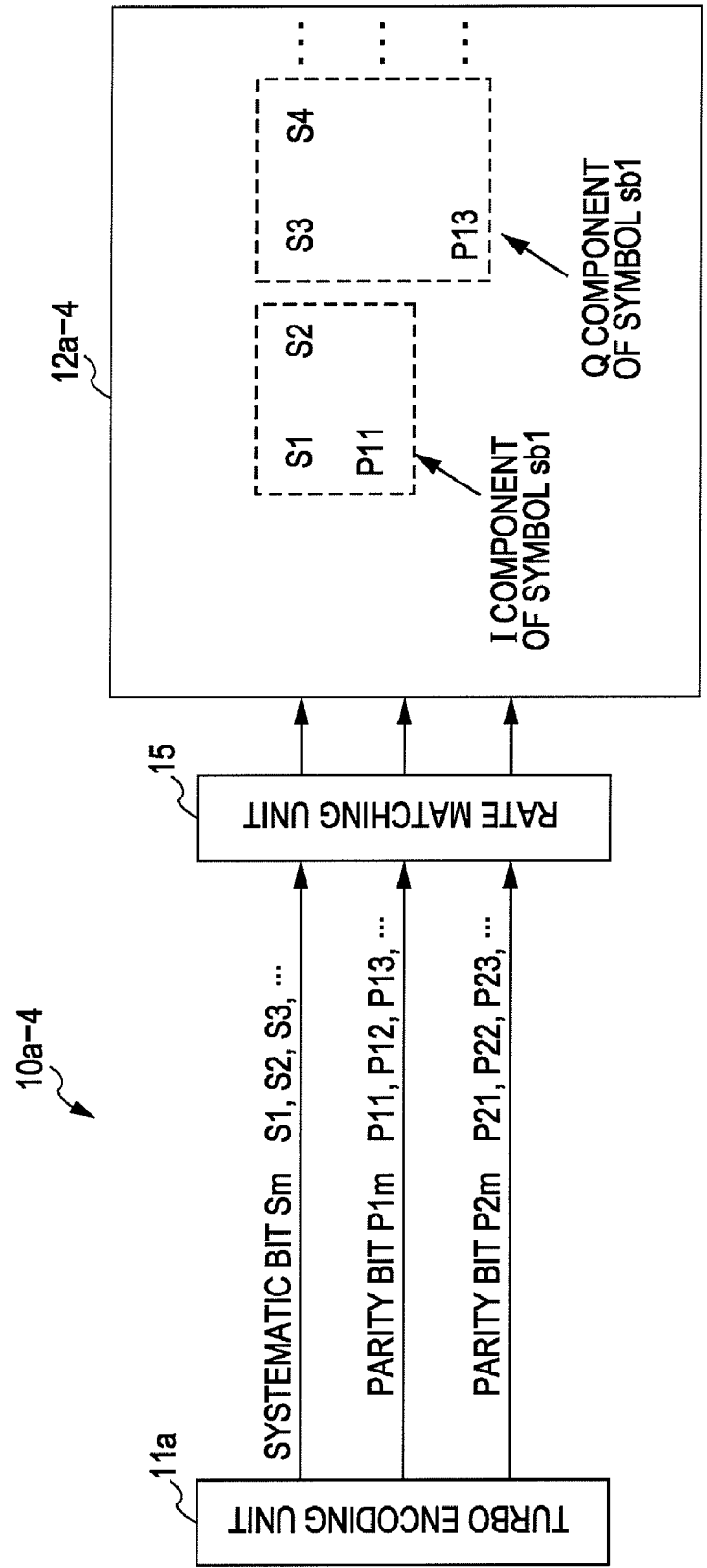
FIG. 28 is a diagram illustrating symbol mapping after rate matching.

A transmitting apparatus 10a-4 illustrated in FIG. 28 performs 64QAM mapping and there is a large puncture. Also, there is no set of the systematic bit S, the parity bit P1, and the parity bit P2.

The rate matching unit 15 removes the parity bits P12 and P14 and the parity bits P21, P22, P23, and P24. In this case, a symbol mapping unit 12a-4 maps (51, S2, P11) to the I component of the symbol sb1 and maps (S3, S4, P13) to the Q component of the symbol sb1.

As such, in the case in which the rate matching unit 15 removes a parity bit P1m or a parity bit P(n+1)m corresponding to the systematic bit Sm, when there is a set of the systematic bit S and the parity bits P1 and P2 corresponding to the systematic bit S, the set is mapped to one symbol.

When there is no corresponding bit, a set of the systematic bit Sm and at least one of a systematic bit Sh (h≠m), a parity bit P1i (i≠m), and a parity bit P(n+1)j (j≠m) is mapped to one symbol.

Figure 29:
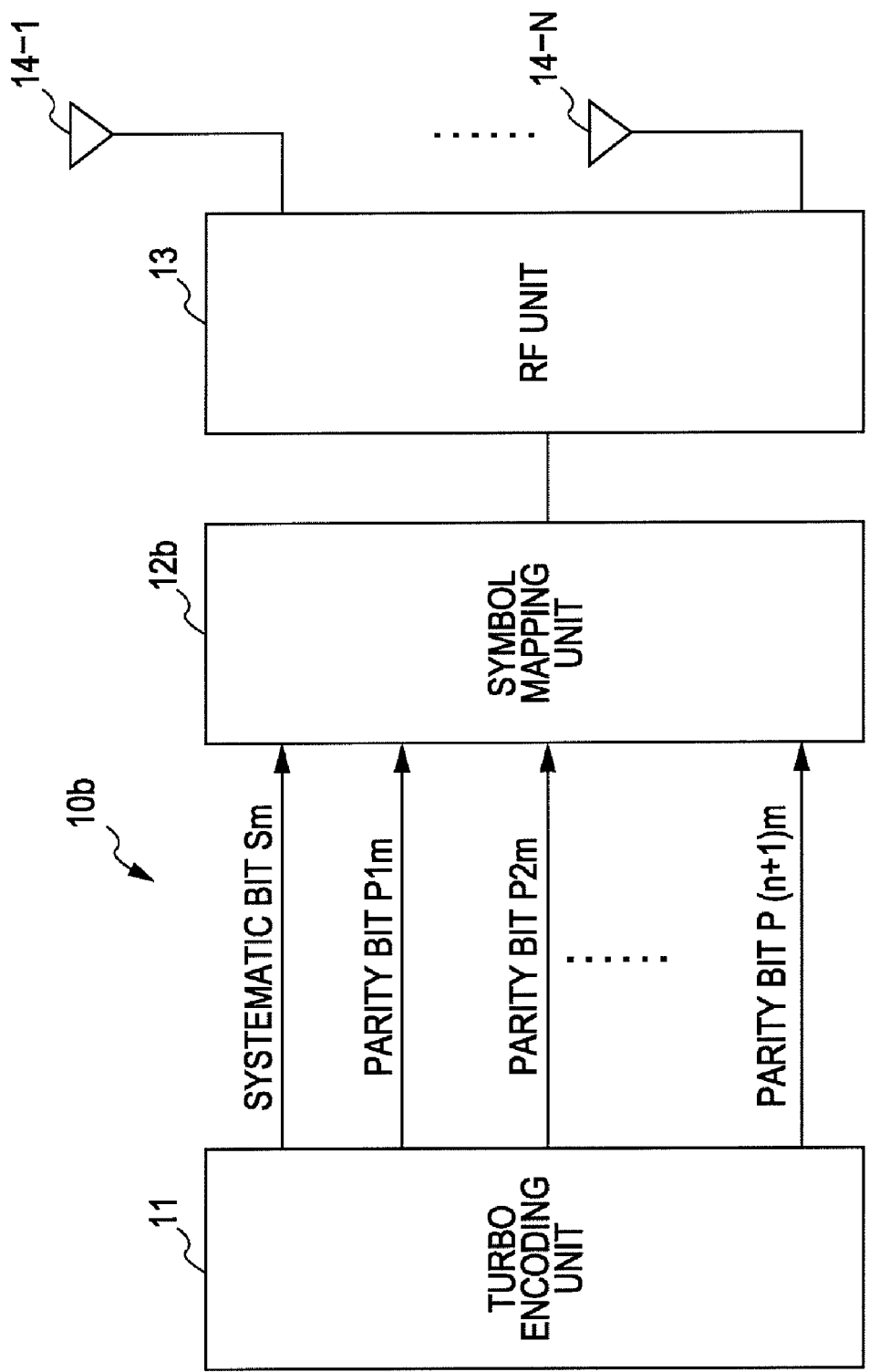
FIG. 29 is a diagram illustrating a transmitting apparatus including a plurality of antennas.

Next, symbol mapping when a plurality of antennas are used to perform MIMO (multi input multi output: a wireless communication technique for using a plurality of antennas to transmit and receive data) communication will be described. FIG. 29 is a diagram illustrating a transmitting apparatus including a plurality of antennas. A transmitting apparatus 10b includes a turbo encoding unit 11, a symbol mapping unit 12b, an RF unit 13, and antennas 14-1 to 14-N.

When the MIMO communication is performed, it is possible to effectively use information between the symbols that are simultaneously transmitted from the antennas 14-1 to 14-N. As a result, reception quality is likely to be improved. Therefore, the systematic bit Sm and parity bits P1m and P(n+1)m corresponding thereto are mapped to the symbols that are simultaneously transmitted from the antennas 14-1 to 14-N.

For example, when three antennas 14-1, 14-2, and 14-3 are provided and the systematic bit S, the parity bit P1, and the parity bit P2 are respectively output from the antenna 14-1, the antenna 14-2, and the antenna 14-3 at the same time, the symbol mapping unit 12b maps the systematic bit S, the parity bit P1, and the parity bit P2 to a set (symbol) including the bits simultaneously output from the antennas.

Figure 30:
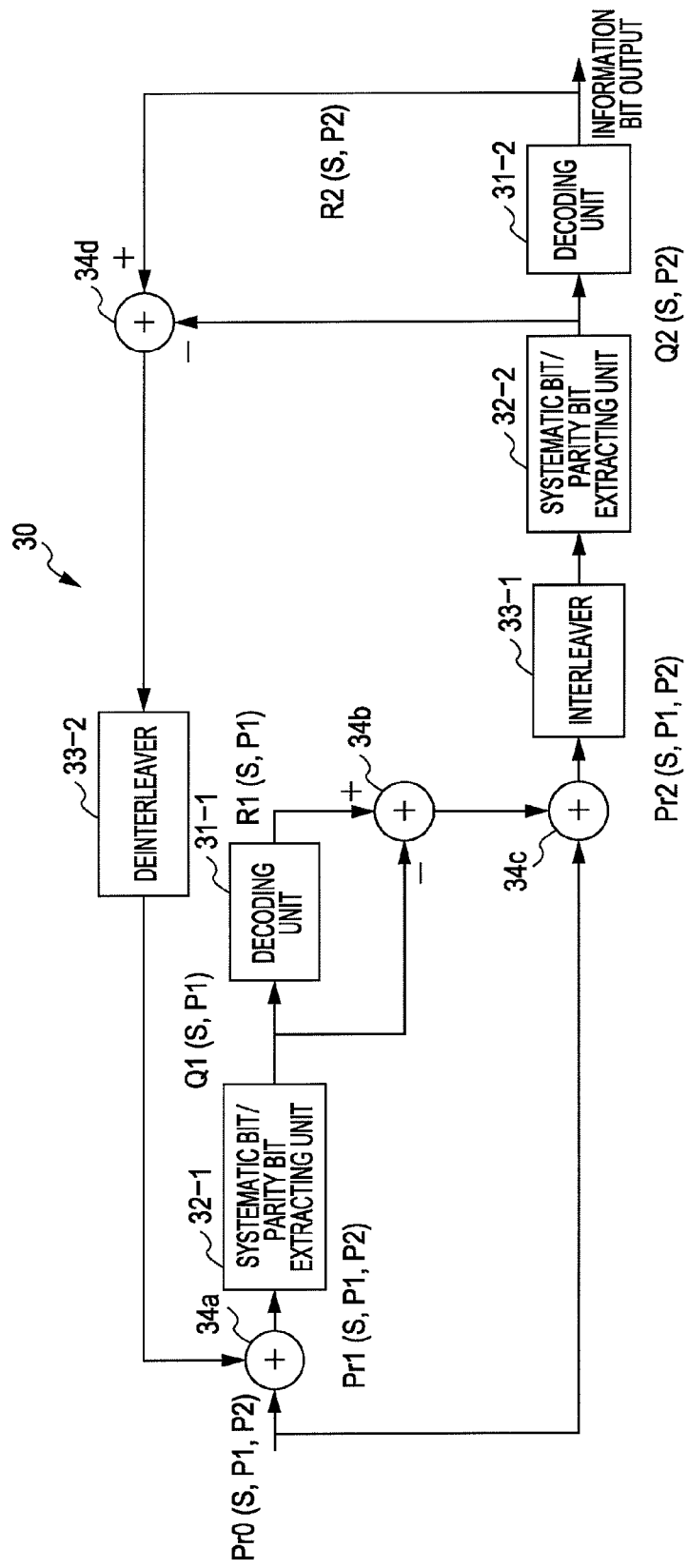
FIG. 30 is a diagram illustrating a modification of the turbo decoding unit.
Figure 31:
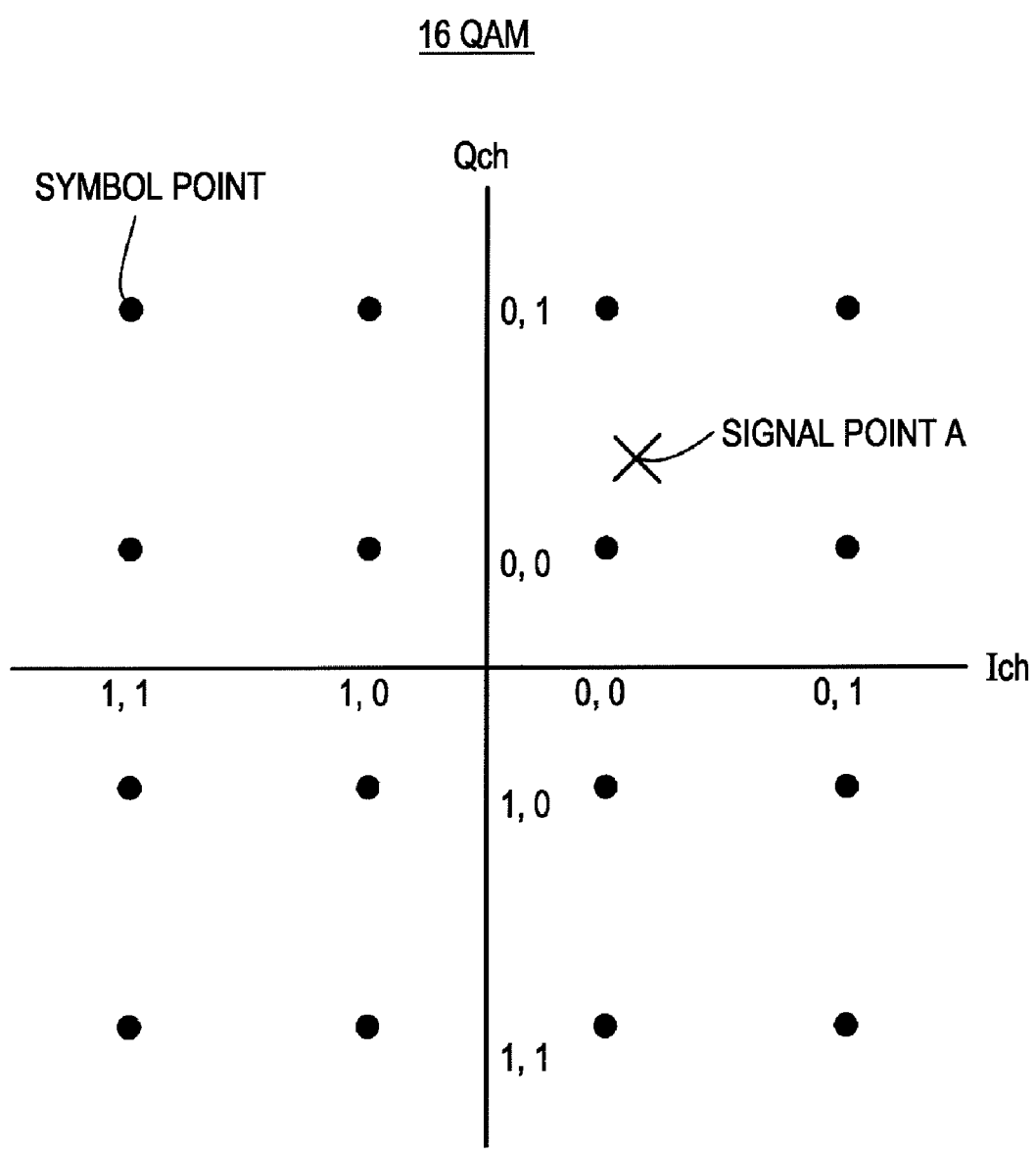
FIG. 31 is a diagram illustrating the constellation of 16QAM.

Next, a modification of the turbo decoding unit 23 will be described. FIG. 30 is a diagram illustrating a modification of the turbo decoding unit. A turbo decoding unit 30, which is a modification of the turbo decoding unit 23, uses returned likelihood for decoding without separating the returned likelihood. That is, a decoding unit 31-1 determines only the systematic bit S having high likelihood based on the systematic bit S and the parity bit P1, and outputs both the systematic bit S and the parity bit P1 corresponding thereto.

A decoding unit 31-2 determines the systematic bit S having high likelihood based on the input systematic bit S and the parity bit P2, and outputs both the systematic bit S and the parity bit P2 corresponding thereto. The systematic bit S and the parity bit P2 return to the decoding unit 31-1. This operation is circulated to perform decoding.

The turbo decoding unit 30 includes decoding units 31-1 and 31-2, systematic bit/parity bit extracting units 32-1 and 32-2, an interleaver 33-1, a deinterleaver 33-2, and arithmetic units 34a to 34d.

The arithmetic unit 34a adds a likelihood Pr0(S, P1, P2), which is the likelihood of a set of the systematic bit S and the parity bits P1 and P2 and the output of the deinterleaver 33-2. The systematic bit/parity bit extracting unit 32-1 extracts the systematic bit S and the parity bit P1 from the output (a likelihood Pr1(S, P1, P2)) of the arithmetic unit 34a and outputs a likelihood Q1(S, P1).

The decoding unit 31-1 outputs a likelihood R1(S, P1), which is a set of the likelihood of the systematic bit S that is estimated to have high likelihood in the likelihood Q1(S, P1) and the corresponding parity bit P1. The arithmetic unit 34b subtracts the likelihood Q1(S, P1) from the likelihood R1(S, P1).

The arithmetic unit 34c outputs a likelihood Pr2(S, P1, P2) by adding the likelihood Pr0(S, P1, P2) and the output of the arithmetic unit 34b. The interleaver 33-1 interleaves the added result on a bit basis. The systematic bit/parity bit extracting unit 32-2 extracts the systematic bit S and the parity bit P2 from the output of the interleaver 33-1, and outputs a likelihood Q2(S, P2).

The decoding unit 31-2 decodes the likelihood Q2(S, P2) and outputs a likelihood R2(S, P2), which is a set of the likelihood of the systematic bit S that is estimated to have high likelihood and the corresponding parity bit P2. The arithmetic unit 34d subtracts the likelihood Q2(S, P2) from the likelihood R2(S, P2). The deinterleaver 33-2 deinterleaves the output of the arithmetic unit 34d on a bit basis, and transmits the deinterleaved result to the arithmetic unit 34a.

As described above, the communication system 1 performs bit-based interleaving/deinterleaving and then performs turbo encoding. Therefore, it is possible to improve a random property and characteristics.

In addition, an m-th systematic bit Sm, an m-th parity bit P1m, and m-th parity bits P(n+1)m are mapped to a symbol of one of the I and Q components, and an (m+1)-th systematic bit Sm+1, an (m+1)-th parity bit P1(m+1), and (m+1)-th parity bits P(n+1)(m+1) are mapped to a symbol of the other component. Turbo decoding is performed on a set of the systematic bit Sm mapped to the same symbol and a parity bit Pkm ($1 \leq k \leq n+1$: k is a natural number) corresponding to the systematic bit Sm, without separating the bits.

According to the embodiment, the transmitter side maps a systematic bit and a parity bit corresponding to the systematic bit to one symbol. The receiver side decodes the systematic bit mapped to the same symbol and a parity bit corresponding thereto, without separating the bits. Therefore, when turbo encoding/decoding communication is performed, it is possible to prevent the loss of information between the bits and perform bit-based decoding. Therefore, it is possible to reduce storage capacity, and thus reduce a circuit size. In addition, it is possible to improve characteristics.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

What is claimed is:

1. A communication system that performs encoding and decoding for communication, comprising:
   a transmitting apparatus; and
   a receiving apparatus,
   wherein the transmitting apparatus includes:
   a turbo encoding unit including a first encoding unit that encodes an input signal and generates a first parity bit by bit-based encoding and n (n=1, 2, 3, ... ) second encoding units that encode the input signal and generate n second parity bits by bit-based encoding; and
   a symbol mapping unit that maps an output from the turbo encoding unit to a symbol by bit-based mapping operation and modulates the output, and
   the receiving apparatus includes:
   a demodulating unit that demodulates a transmission signal; and
   a turbo decoding unit that performs turbo decoding on the demodulated transmission signal by bit-based decoding, wherein
   the second encoding units each include an interleaver that interleaves the input signal by bit-based interleaving, an element encoding unit that encodes the interleaved signal, and a deinterleaver that deinterleaves an output from the element encoding unit and generates the second parity bits by bit-based deinterleaving,
   the turbo encoding unit outputs, with respect to the input signal, one systematic bit which is a bit output of the input signal, the first parity bit, and the n second parity bits, and
   the symbol mapping unit maps a mixture of the systematic bit and a parity bit corresponding to the systematic bit to each of I and Q components of one symbol in accordance with a given rule as the bit-based mapping operation.

2. The communication system according to claim 1, wherein,
   when an m-th (m=1, 2, 3, ... ) output systematic bit is a systematic bit Sm, an m-th output first parity bit is a parity bit P1m, and an m-th output second parity bit is a parity bit P(n+1)m,
   the symbol mapping unit maps the m-th systematic bit Sm, the m-th first parity bit P1m, and the m-th second parity bits P(n+1)m to a symbol of one of an I component and a Q component, and maps an (m+1)-th systematic bit Sm+1, an (m+1)-th first parity bit P1(m+1), and (m+1)-th second parity bits to P(n+1)(m+1) to a symbol of another of the I component and the Q component.

3. The communication system according to claim 2, wherein
   the transmitting apparatus further includes a rate matching unit that is provided between the turbo encoding unit and the symbol mapping unit and changes a transmission range, and
   when the rate matching unit removes the parity bit P1m or the parity bit P(n+1)m corresponding to the systematic bit Sm, a set of the systematic bit Sm and at least one of a systematic bit Sh (h≠m), a parity bit P1i (i≠m), and a parity bit P(n+1)j (j≠m) is mapped to one symbol.

4. The communication system according to claim 2, wherein, when the transmitting apparatus uses a plurality of antennas to perform data transmission, the symbol mapping unit maps the systematic bit Sm and the corresponding parity bits P1m and P(n+1)m to the symbols simultaneously transmitted from the plurality of antennas.

5. The communication system according to claim 2, wherein the turbo decoding unit performs turbo decoding on a set of the systematic bit Sm mapped to the same symbol and a parity bit Pkm ($1 \leq k \leq n+1$: k is a natural number) corresponding to the systematic bit Sm without separating the bits.

6. The communication system according to claim 1, wherein the symbol mapping unit maps the systematic bit to a most significant bit of the I component and a most significant bit of the Q component.

7. The communication system according to claim 1, wherein the symbol mapping unit performs mapping to the I and Q components of 64QAM, n is 1, and an encoding rate is ⅓.

8. The communication system according to claim 1, wherein the symbol mapping unit alternately maps the first parity bit and the second parity bits to a least significant bit of the symbol.

9. A transmitting apparatus that performs encoding for communication, comprising:
- a turbo encoding unit including a first encoding unit that encodes an input signal and generates a first parity bit by bit-based encoding and n (n=1, 2, 3, . . . ) second encoding units that encode the input signal and generate n second parity bits by bit-based encoding; and
- a symbol mapping unit that maps an output from the turbo encoding unit to a symbol by a bit-based mapping operation and modulates the output, wherein
- the second encoding unit includes an interleaver that interleaves the input signal by bit-based interleaving an element encoding unit that encodes the interleaved signal and a deinterleaver that deinterleaves an output from the element encoding unit and generate the second parity bit by bit-based deinterleaving,
- the turbo encoding unit outputs, with respect to the one input signal, one systematic bit which is obit output of the input signal, the one first parity bit, and the n second parity bits, and
- the symbol mapping unit maps a mixture of the systematic bit and the parity bit corresponding to the systematic bit to each of I and Q components of one symbol in accordance with a given rule as the bit-based mapping operation.

10. The transmitting apparatus according to claim 9, wherein,
- when an m-th (m=1, 2, 3, . . . ) output systematic bit is a systematic bit Sm, an m-th output first parity bit is a parity bit P1m, and an m-th output second parity bit is a parity bit P(n+1)m,
- the symbol mapping unit maps the m-th systematic bit Sm, the m-th first parity bit P1m, and the m-th second parity bits P(n+1)m to a symbol of one of an I component and a Q component, and maps an (m+1)-th systematic bit Sm+1, an (m+1)-th first parity bit P1(m+1), and (m+1)-th second parity bits P(n+1)(m+1) to a symbol of the other component.

11. A receiving apparatus that performs decoding for communication, comprising:
- a demodulating unit that demodulates a transmission signal encoded by bit-based turbo encoding operation and mapped by bit-based mapping operation; and
- a turbo decoding unit that performs turbo decoding on the demodulated signal by bit-based decoding, wherein,
- for one systematic bit, one first parity bit, and n second bits transmitted from transmitter side, when an m-th (m=1, 2, 3 . . . ) output systematic bit is a systematic bit Sm, an m-th output first parity bit is a parity bit P1m, and an m-th output second parity bit is a parity bit P(n=1)m (N=1, 2, 3 . . . ),
- the turbo decoding unit receives a symbol of one of an I component and a Q component to which the m-th systematic bit Sm, the m-th first parity bit P1m, and the m-th second parity bits P(n+1)m are mapped, and receives a symbol of the other component to which an (m+1)-th systematic bit Sm+1, an (m+1)-th first parity bit P1(m+1), and (m+1)-th second parity bits P(n+1)(m+1) are mapped, and
- the turbo decoding unit performs turbo decoding on a set of the systematic bit Sm mapped to a same symbol and a parity bit Pkm ($1 \leq k \leq n$: k is a natural number) corresponding to the systematic bit Sm without separating the bits.

12. A method of encoding and decoding for communication, comprising:
- a transmitting apparatus performing:
  - first encoding an input signal and generating a first parity bit by bit-based encoding;
  - second encoding the input signal and generating n (n=1, 2, 3, . . . ) second parity bits by bit-based encoding; and
  - mapping an output from the first and second encoding to a symbol by bit-based mapping operation and modulating the output, and
- a receiving apparatus performing:
  - demodulating a transmission signal; and
  - turbo decoding the demodulated transmission signal by bit-based decoding, wherein
- the second encoding comprises interleaving the input signal by bit-based interleaving, encoding the interleaved signal, and deinterleaving an output from the interleaved signal encoding, and generating the second parity bits by bit-based deinterleaving,
- the first and second encoding output, with respect to the input signal, one systematic bit which is a bit output of the input signal, the first parity bit, and the n second parity bits, and
- the mapping comprises mapping a mixture of the systematic bit and a parity bit corresponding to the systematic bit to each of I and Q components of one symbol in accordance with a given rule as the bit-based mapping operation.

* * * * *